(12) United States Patent
Nakajima

(10) Patent No.: US 11,750,182 B2
(45) Date of Patent: Sep. 5, 2023

(54) INTEGRATED CIRCUIT

(71) Applicant: FUJI ELECTRIC CO., LTD., Kawasaki (JP)

(72) Inventor: Hiroyuki Nakajima, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/954,294

(22) Filed: Sep. 27, 2022

(65) Prior Publication Data
US 2023/0143546 A1    May 11, 2023

(30) Foreign Application Priority Data
Nov. 9, 2021    (JP) .................................. 2021-182655

(51) Int. Cl.
*H03K 5/134* (2014.01)
*H03K 5/131* (2014.01)
*H03K 5/135* (2006.01)
*H03K 5/00* (2006.01)

(52) U.S. Cl.
CPC ............ *H03K 5/134* (2014.07); *H03K 5/131* (2013.01); *H03K 5/135* (2013.01); *H03K 2005/00058* (2013.01)

(58) Field of Classification Search
None
See application file for complete search history.

(56) References Cited

U.S. PATENT DOCUMENTS

| 5,576,634 | A | 11/1996 | Kamiya | |
|---|---|---|---|---|
| 8,261,619 | B2* | 9/2012 | Shin | G04F 10/06 |
| | | | | 73/753 |
| 10,334,195 | B2* | 6/2019 | Saeki | H04N 25/772 |
| 2003/0011502 | A1* | 1/2003 | Watanabe | G04F 10/005 |
| | | | | 341/157 |
| 2005/0134351 | A1 | 6/2005 | Tamura | |

FOREIGN PATENT DOCUMENTS

| JP | H02122725 A | 5/1990 |
|---|---|---|
| JP | H07122992 A | 5/1995 |
| JP | H08129439 A | 5/1996 |
| JP | 2005184196 A | 7/2005 |
| JP | 2010141641 A | 6/2010 |
| JP | 2018119972 A | 8/2018 |

* cited by examiner

*Primary Examiner* — Cassandra F Cox
(74) *Attorney, Agent, or Firm* — Rabin & Berdo, P.C.

(57) ABSTRACT

An integrated circuit having: a signal output circuit configured to output a first digital signal of a first logic level or of a second logic level in response to an analog signal; a first buffer circuit configured to raise and lower a voltage at a terminal of the integrated circuit in response to the first digital signal of a first logic level and a second logic level, respectively; a first digital delay circuit configured to receive a clock signal, and to delay the first digital signal, to output a resultant signal as a first delay signal, based on the received clock signal; and a second buffer circuit configured to raise the voltage at the terminal in response to the first delay signal of the first logic level, and lower the voltage at the terminal in response to the first delay signal of the second logic level.

8 Claims, 15 Drawing Sheets

INTEGRATED CIRCUIT

CROSS-REFERENCE TO RELATED APPLICATION

The present application claims priority pursuant to 35 U.S.C. § 119 from Japanese patent application number 2021-182655 filed on Nov. 9, 2021, the entire disclosure of which is hereby incorporated by reference herein.

BACKGROUND

Technical Field

The present disclosure relates to an integrated circuit.

Description of the Related Art

There has been known a sensor coupled to an AD converter (see, for example, Japanese Patent Application Publication No. 2018-119972). Further, an analog signal from the sensor may be converted into a digital signal of a predetermined standard and outputted through a buffer circuit (see, for example, Japanese Patent Application Publication No. Hei8-129439).

There has been known an integrated circuit including a signal output circuit that converts an analog signal into a digital signal of a predetermined standard and outputs the digital signal, and a buffer circuit for transmitting the digital signal outputted from the signal output circuit. In such an integrated circuit, change in output voltage in the buffer circuit may cause noise to the analog signal before conversion.

SUMMARY

An aspect of an embodiment of the present disclosure is an integrated circuit having a terminal, the integrated circuit comprising: a signal output circuit configured to output a first digital signal of a first logic level or a second logic level in response to an analog signal; a first buffer circuit configured to raise a voltage at the terminal in response to the first digital signal of the first logic level, and lower the voltage at the terminal in response to the first digital signal of the second logic level; a first digital delay circuit configured to receive a clock signal, and to delay the first digital signal, to thereby output a resultant signal as a first delay signal, based on the received clock signal; and a second buffer circuit configured to raise the voltage at the terminal in response to the first delay signal of the first logic level, and lower the voltage at the terminal in response to the first delay signal of the second logic level.

Note that the summary of the disclosure described above does not list all the features of the present disclosure. Sub-combinations of these features may also fall within the present disclosure.

BRIEF DESCRIPTION OF THE DRAWINGS

FIG. 2 illustrates a configuration example of an integrated circuit 100a.

FIG. 3 illustrates a configuration example of an output circuit 23a.

DETAILED DESCRIPTION

The present disclosure will be described below through embodiments of the disclosure, but the following embodiments are not intended to limit the disclosure according to the scope of claims. Also, not all the combinations of the features described in the embodiments are necessarily essential to the solutions of the disclosure.

A term "couple" used herein means to "electrically couple" unless otherwise noted. Also, herein, a low logic level of a voltage or a signal is referred to as low, and a high logic level of a voltage or a signal is referred to as high.

<<Overview of Integrated Circuit 100 and Microcomputer 200>>

Figure 1:
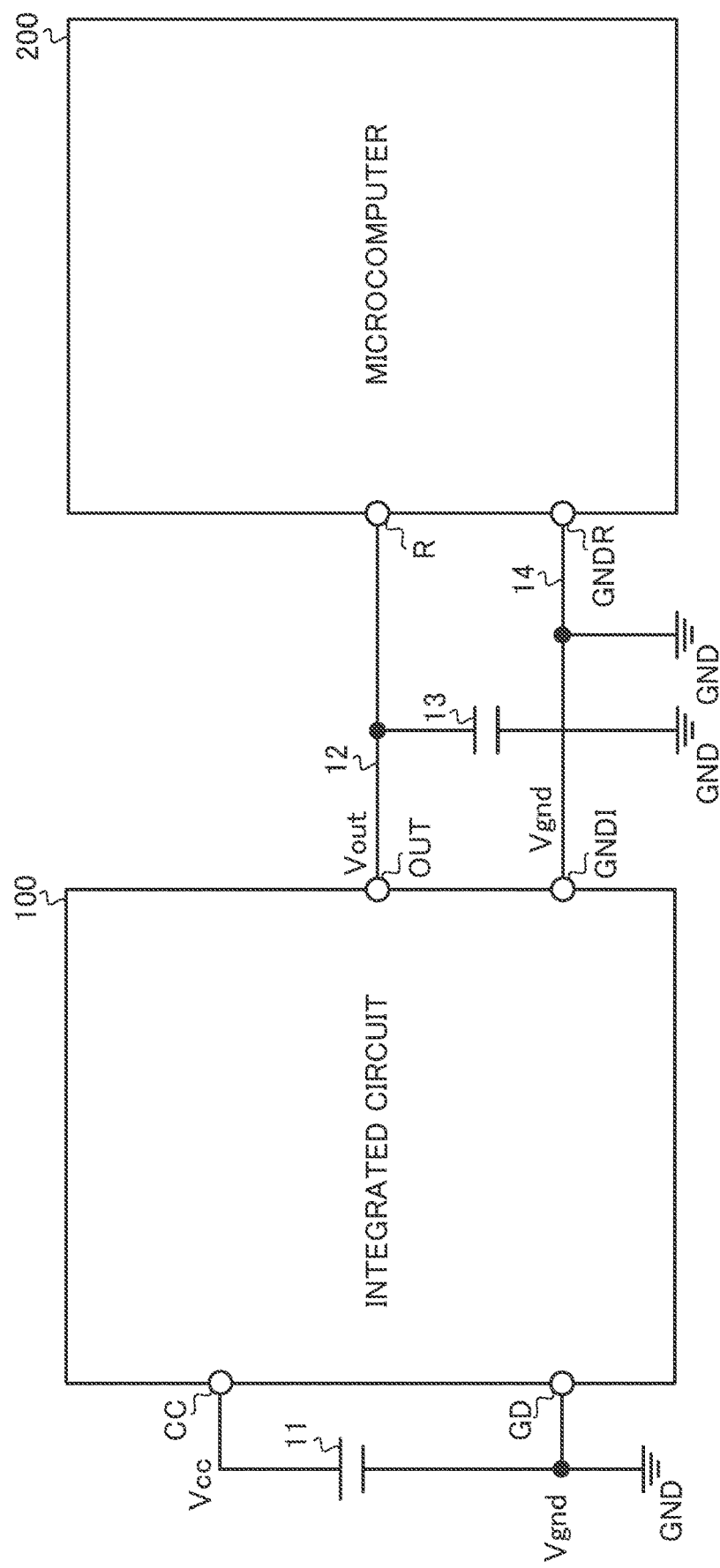
FIG. 1 illustrates a configuration example of an integrated circuit 100 and a microcomputer 200 used in an automobile.

FIG. 1 illustrates a configuration example of an integrated circuit (IC) 100 and a microcomputer 200 used in an automobile.

The integrated circuit 100 measures a pressure (and temperature) of air introduced into a predetermined part (e.g., an engine cylinder) of an automobile, for example, and outputs the measured result as a digital signal to the microcomputer 200 (to be described later). The integrated circuit 100 has terminals CC, GD, OUT, and GNDI.

The microcomputer 200 is an electronic control unit (ECU) that controls various parts of the automobile in response to the digital signal from the integrated circuit 100. The microcomputer 200 can control the automobile in response to the digital signal from the integrated circuit 100. The microcomputer 200 has terminals R and GNDR.

Upon detecting a physical quantity, the integrated circuit 100 converts an analog signal indicating the physical quantity into a digital signal. An output circuit (to be described later) in the integrated circuit 100 changes a voltage Vout applied to the terminal OUT through the output circuit, in response to the digital signal.

The terminal CC is a terminal to which a positive electrode of a power supply 11 to operate the integrated circuit 100 is coupled. The terminal CC receives a voltage Vcc from the power supply 11. On the other hand, a negative electrode of the power supply 11 is grounded.

The terminal GD is grounded such that a voltage at the terminal GD is set to the ground potential Vgnd (e.g., 0V) which is a reference for an operation of the integrated circuit 100.

The terminal OUT is coupled to the terminal R of the microcomputer 200 through wiring 12. As an example, the wiring 12 is a harness having a predetermined resistance. A capacitor 13 having one end grounded is coupled to the wiring 12 to remove noise superimposed on the voltage Vout which is to be outputted to the microcomputer 200.

In other words, various loads, such as the resistance of the wiring 12, a capacitance of the capacitor 13, an impedance based on an internal element of the microcomputer 200, and the like, are coupled to the terminal OUT. Accordingly, the integrated circuit 100 includes a buffer circuit (to be described later) so that the voltage Vout of the microcomputer 200 and the load can be appropriately changed.

The terminal GNDI is coupled to the terminal GNDR of the microcomputer 200 through wiring 14 and is also grounded. In other words, the terminal GNDI, the wiring 14, and the terminal GNDR are set to the ground potential Vgnd.

<<Configuration of Integrated Circuit 100a>>

Figure 2:
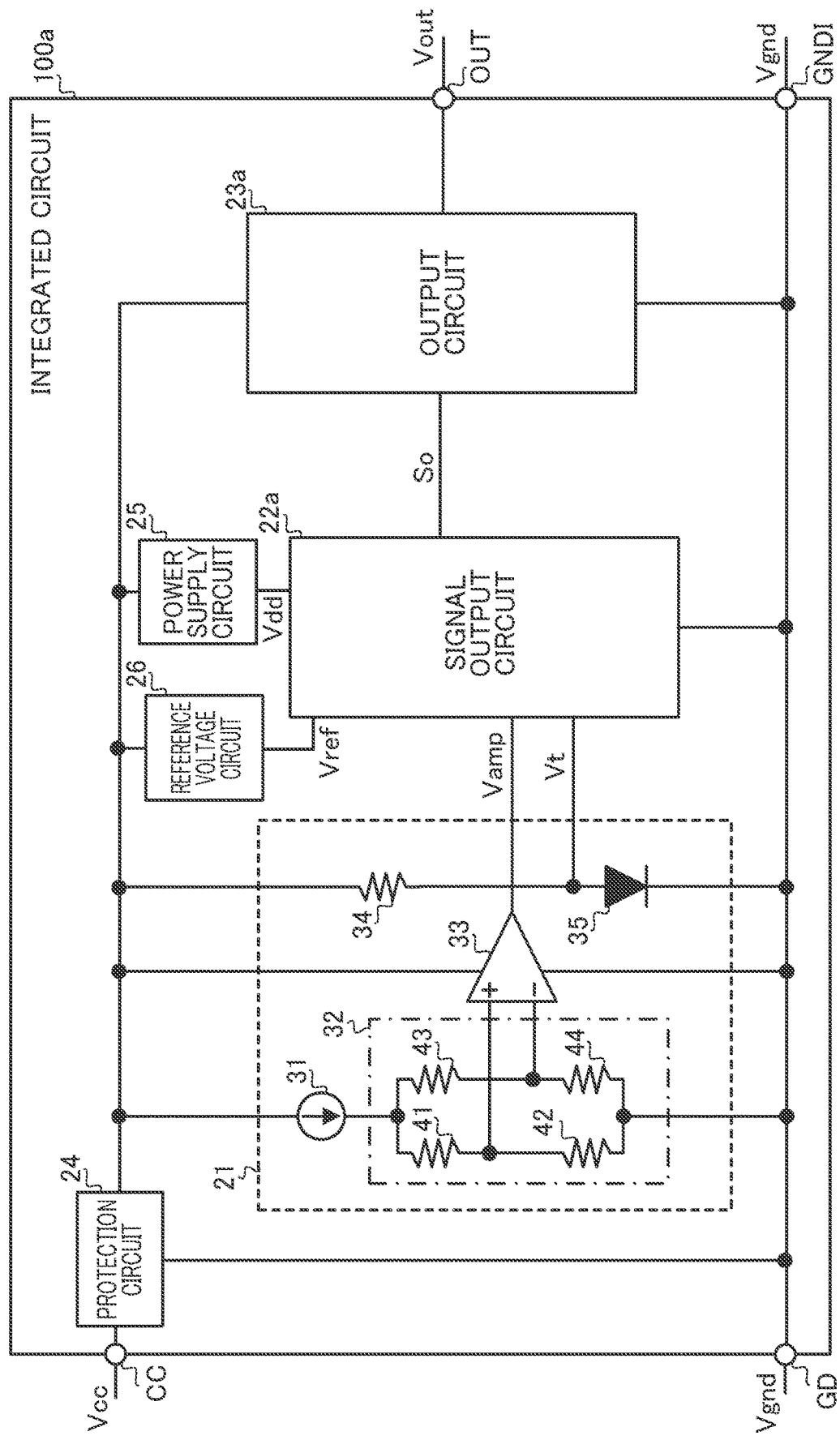

FIG. 2 illustrates a configuration example of an integrated circuit 100a. The integrated circuit 100a includes a sensor 21, a signal output circuit 22a, an output circuit 23a, a protection circuit 24, a power supply circuit 25, and a reference voltage circuit 26. The integrated circuit 100a also has terminals CC, GD, OUT, and GNDI which have already given in FIG. 1.

The sensor 21 detects a physical quantity for the ECU to control the automobile, and outputs an analog signal corresponding to the detected physical quantity to the signal output circuit 22a.

Although the details will be described later, the sensor 21 has a configuration to detect a pressure and a temperature. The sensor 21 outputs an analog signal including a signal Vamp corresponding to the pressure, and a signal Vt corresponding to the temperature to the signal output circuit 22a.

The sensor 21 includes, but is not limited to, a pressure sensor and a temperature sensor. For example, the sensor 21 may include sensor(s) to detect current, speed, angle, position, rotation direction, rotation speed, rotation angle, and/or the like.

Although the sensor 21 is included in the integrated circuit 100a, the configuration of the entire or part of the sensor 21 may be provided outside the integrated circuit 100a. For example, a temperature sensor including a thermistor in the sensors 21 may be provided outside the integrated circuit. As another example, a diaphragm of the pressure sensor (to be described later) may be provided on a semiconductor chip different from the integrated circuit 100a.

The signal output circuit 22a outputs a signal So of a single edge nibble transmission (SENT) standard in response to the signals Vamp and Vt corresponding to the physical quantity detected by the sensor 21.

Here, the standard of the signal transmitted by the signal output circuit 22a is not limited to the SENT standard. For example, the signal transmitted by the signal output circuit 22a may be of a peripheral sensor interface 5 (PSI5) standard, or may be of a standard such as a distributed system interface (DSI), a clock extension peripheral interface (CXPI), or the like.

The output circuit 23a changes the voltage Vout at the terminal OUT according to a logic level of the signal So which is a digital signal. An internal configuration of the output circuit 23a will be described later in detail with reference to FIG. 3.

The protection circuit 24 clamps a voltage of a power supply line such that the voltage of the power supply line that receives the voltage Vcc does not reach or exceed a predetermined value when a surge voltage is superimposed on the voltage Vcc, for example. The protection circuit 24 includes, for example, a Zener diode (not illustrated).

The power supply circuit 25 generates a voltage Vdd to operate the signal output circuit 22a based on the voltage Vcc.

The reference voltage circuit 26 generates a reference voltage Vref used when the signal output circuit 22a converts the analog signals Vamp and Vt into digital signals. Although the details will be described later, the reference voltage Vref is used in the analog-to-digital (AD) converter in the signal output circuit 22a.

==Details of Sensor 21==

The sensor 21 includes a current source 31, a bridge circuit 32, an amplifier 33, a resistor 34, and a diode 35. Although the details will be described later, the bridge circuit 32 and the amplifier 33 operate as the pressure sensor, and the diode 35 operates as the temperature sensor.

===Pressure Sensor===

The current source 31 supplies a constant current to the bridge circuit 32. Thus, when the bridge circuit 32 is in a steady state, the bridge circuit 32 applies a constant voltage to the amplifier 33. When the bridge circuit 32 detects a pressure fluctuation, the bridge circuit 32 applies to the amplifier 33 a voltage that fluctuates according to the pressure fluctuation.

The bridge circuit 32 configures a Wheatstone bridge arranged in a diaphragm (not illustrated) formed in the integrated circuit 100a. The bridge circuit 32 includes resistors 41 to 44. The resistors 41 to 44 are Piezo resistors to detect a deflection of the diaphragm caused by the pressure applied to the diaphragm.

In the bridge circuit 32, when the diaphragm is deflected by a pressure, resistance values of the resistors 41 to 44 fluctuate. As an example, when the diaphragm is deflected to one direction parallel to the installation direction, current paths of the resistors 41 and 44 arranged on the sides opposite to each other of the Wheatstone bridge are extended in a widening direction, and the resistance values are lowered. In this case, the resistors 42 and 43 are extended in a direction in which the current paths are extended, and the resistance values increase.

When the diaphragm bends in a direction opposite to the installation direction, the resistance values of the resistors 41 and 44 increase, and the resistance values of the resistors 42 and 43 decrease. In such cases, the change in the resistance value in the bridge circuit 32 results in a change in voltage in the amplifier 33, according to the current from the current source 31.

The amplifier 33 amplifies voltage change caused by the change in the resistance values of the resistors 41 to 44, to output the signal Vamp to the signal output circuit 22a. The amplifier 33 is coupled to a node between the resistors 41 and 42 and a node between the resistors 43 and 44, which are nodes diagonally arranged in the Wheatstone bridge configured with the bridge circuit 32.

As such, in the integrated circuit 100a, upon detecting a pressure fluctuation, the bridge circuit 32 coupled to the current source 31 applies to the amplifier 33 a voltage that fluctuates according to the pressure fluctuation. Then, the amplifier 33 amplifies the voltage applied from the bridge circuit 32, to output a resultant as the signal Vamp to the signal output circuit 22a.

===Temperature Sensor===

The resistor 34 is an element that adjusts a current flowing through the diode 35, and is coupled to a line that receives the voltage Vcc.

The diode 35 is an element that operates as the temperature sensor. A forward voltage at a PN junction of the diode 35 changes with the temperature. Here, the voltage at a node between the resistor 34 and the diode 35 is outputted as a signal Vt corresponding to the temperature to the signal output circuit 22a. The signal output circuit 22a reads change in the signal Vt, thereby being able to read change in temperature in the integrated circuit 100a.

Although the diode 35 is used as the temperature sensor in the integrated circuit 100a as such, the present disclosure is not limited thereto, and a thermistor may be used, for example.

The signal Vamp corresponds to a "first analog signal", the signal Vt corresponds to a "second analog signal", and the signal So corresponds to a "first digital signal".

==Details of Output Circuit 23a==

Figure 3:
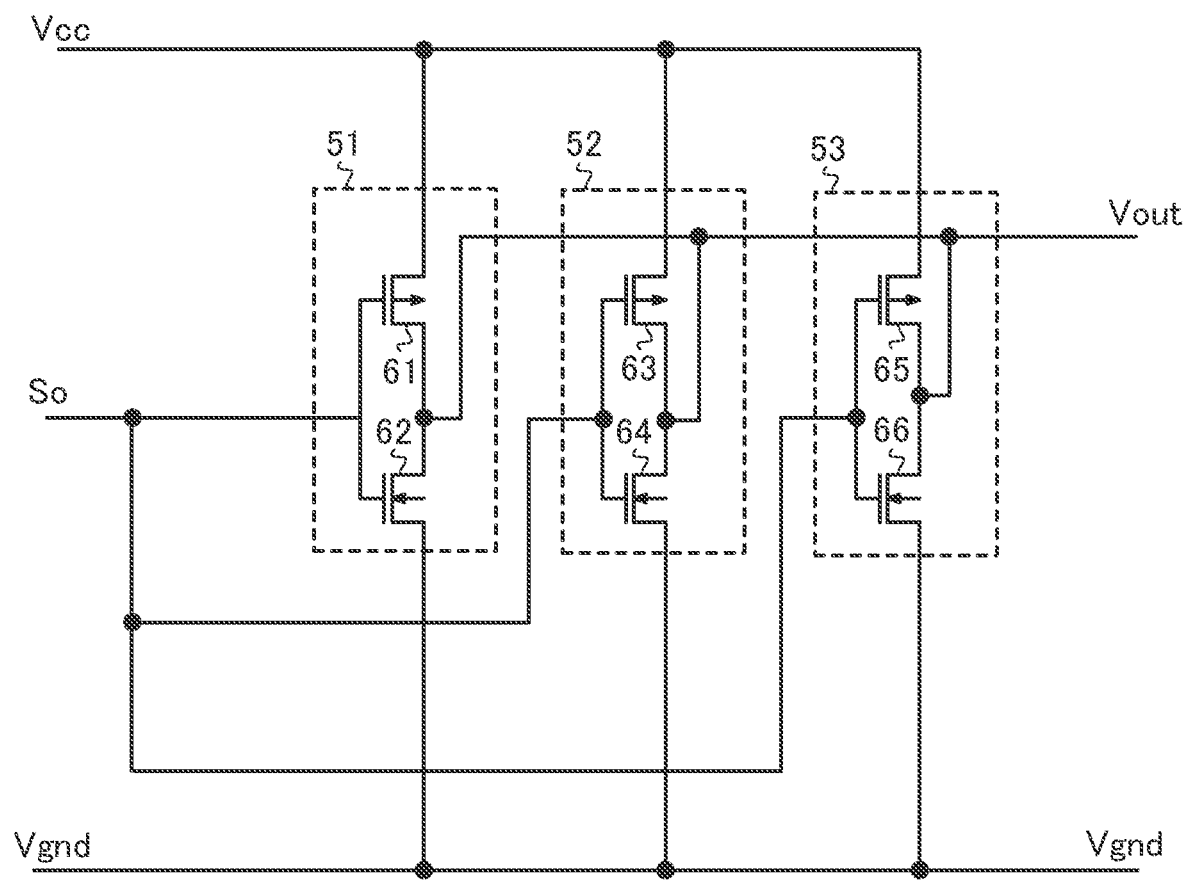

FIG. 3 illustrates a configuration example of an output circuit 23a. The output circuit 23a includes buffer circuits 51 to 53.

The buffer circuit 51 is an inverter circuit including a P-type metal-oxide-semiconductor (MOS) transistor 61 and an N-type MOS transistor 62. The buffer circuit 51 raise the voltage Vout at the terminal OUT to be high (voltage Vcc) in response to the low signal So, and lowers the voltage Vout at the terminal OUT to be low (ground potential Vgnd) in response to the high signal So. The output of the buffer circuit 51 is coupled to the terminal OUT.

In the output circuit 23a, the buffer circuit 52 includes a P-type MOS transistor 63 and an N-type MOS transistor 64, and the buffer circuit 53 includes a P-type MOS transistor 65 and an N-type MOS transistor 66. In other words, the buffer circuits 52 and 53 each also operate as an inverter circuit that is functionally same as the buffer circuit 51.

Accordingly, the buffer circuits 52 and 53 also raise the voltage Vout at the terminal OUT in response to the low signal So, and lowers the voltage Vout at the terminal OUT in response to the high signal So.

As described above, the voltage Vout of a logic level opposite to that of the signal So is applied to the terminal OUT.

<<Influence of Voltage Vout on Signal Vamp in Integrated Circuit 100a>>

Figure 4:
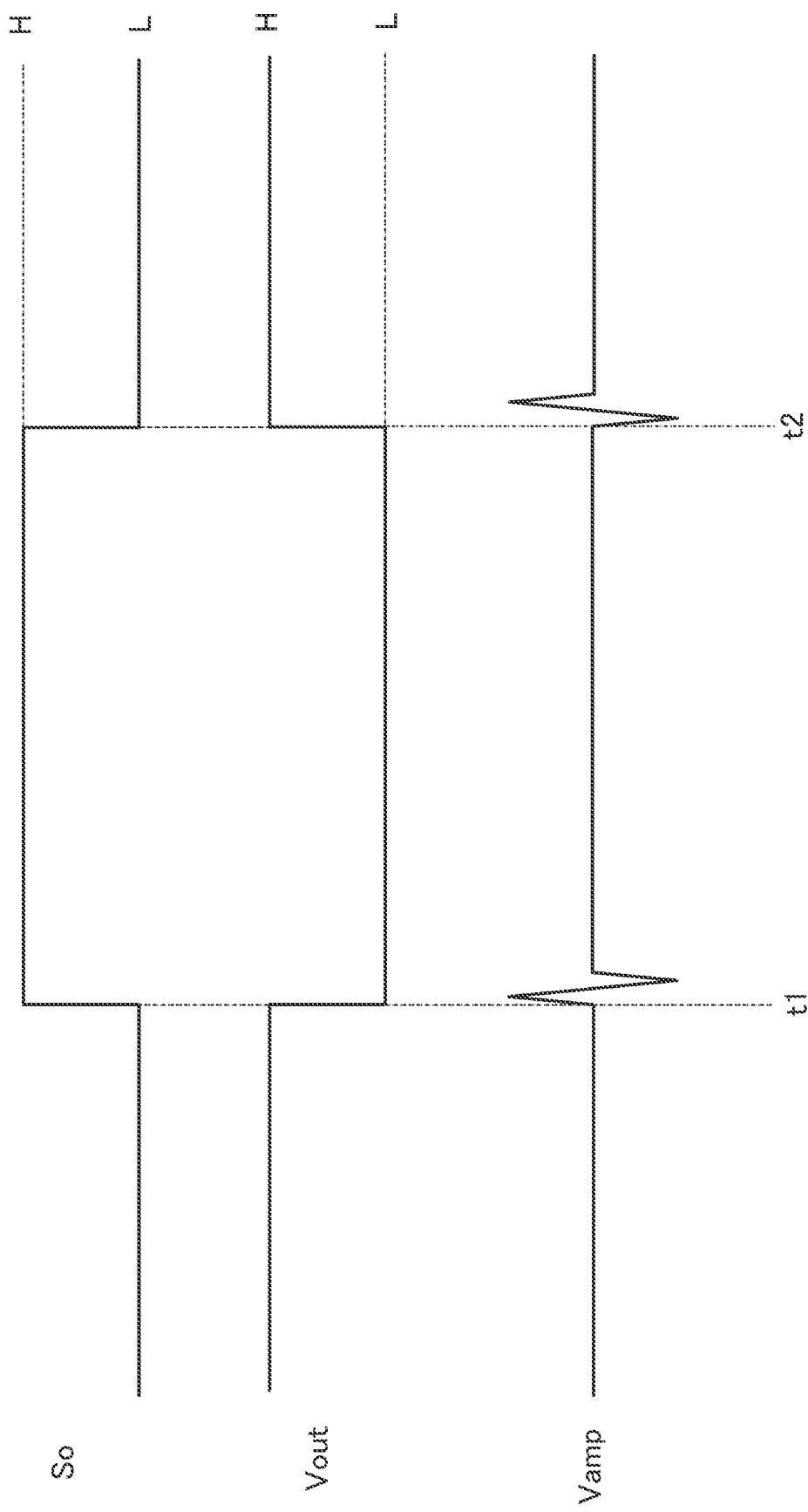
FIG. 4 is an example of a conceptual diagram illustrating a relationship among a signal So, a voltage Vout, and a noise generated in a signal Vamp.

FIG. 4 is an example of a conceptual diagram illustrating a relationship among the signal So, the voltage Vout, and a noise generated in the signal Vamp.

It is assumed here that, until time t1, the signal output circuit 22a of FIG. 2 outputs a low signal So. As has been already described with reference to FIG. 3, since the buffer circuits 51 to 53 of the output circuit 23a operate as inverters, a high voltage Vout is applied to the terminal OUT.

At time t1, the signal output circuit 22a changes the signal So from low to high. In accordance therewith, the output circuit 23a changes the level of the voltage Vout applied to the terminal OUT from high to low.

As described above, a parasitic capacitance at the terminal OUT is large. Accordingly, as illustrated in FIG. 3, the output circuit 23a has the three buffer circuits 51 to 53 having a high current driving capability to change the voltage Vout between the voltage Vcc and the ground potential Vgnd.

As a result, in response to the output circuit 23a operating, radiation noise, spike noise to an internal power supply, coupling noise, and/or the like are generated, and the spike noise may be superimposed on the signal Vamp from the amplifier 33.

When the signal output circuit 22a outputs the signal So in response to the signal Vamp with the spike noise superimposed thereon, an erroneous analog value is taken into the signal So. As a result, output accuracy of the sensor 21 decreases.

At time t2, the signal output circuit 22a changes the signal So that is to be outputted to the output circuit 23a from high to low. In accordance therewith, the output circuit 23a changes the level of the voltage Vout that is to be applied to the terminal OUT to high.

In this case as well, spike noise may be generated in the signal Vamp. Accordingly, the accuracy of the signal So that is to be outputted from the signal output circuit 22a in response to the voltage Vamp decreases. Further, the accuracy of the signal that is to be outputted to the microcomputer 200 decreases with the change in the voltage Vout that is applied to the terminal OUT from the output circuit 23a in response to the signal So.

Hereinafter, output circuits 23b and 23c capable of reducing such spike noise and integrated circuits 100b and 100c including the output circuits 23b and 23c, respectively, will be described.

<<Configuration of Integrated Circuit 100b According to First Embodiment>>

Figure 5:
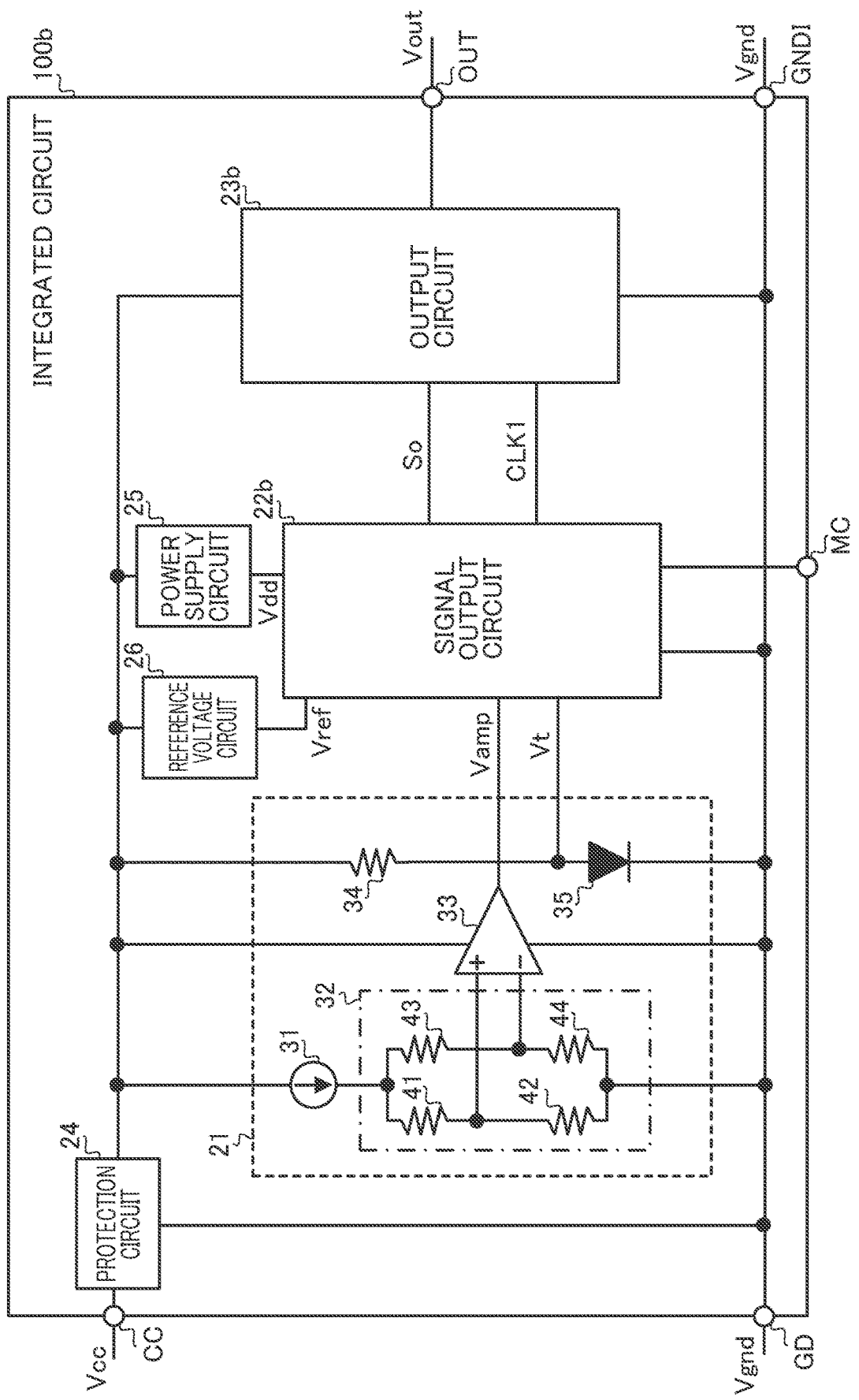
FIG. 5 illustrates a configuration example of an integrated circuit 100b according to a first embodiment.

FIG. 5 illustrates a configuration example of the integrated circuit 100b according to the first embodiment. The following mainly describes differences between the integrated circuits 100b and 100a. In FIG. 5, parts or components that are the same as those of the integrated circuit 100a in FIG. 2 are given the same reference numerals.

The integrated circuit 100b includes a sensor 21, a signal output circuit 22b, an output circuit 23b, a protection circuit 24, a power supply circuit 25, a reference voltage circuit 26, and terminals CC, GD, OUT, GNDI, and MC. In other words, the integrated circuit 100b is different from the integrated circuit 100a in including the signal output circuit 22b, the output circuit 23b, and the terminal MC.

In the integrated circuit 100b according to an embodiment of the present disclosure, as will be described later with reference to FIG. 6, the signal output circuit 22b outputs a clock signal CLK1 to the output circuit 23b in addition to a digital signal So.

==Signal Output Circuit 22b According to First Embodiment==

Figure 6:
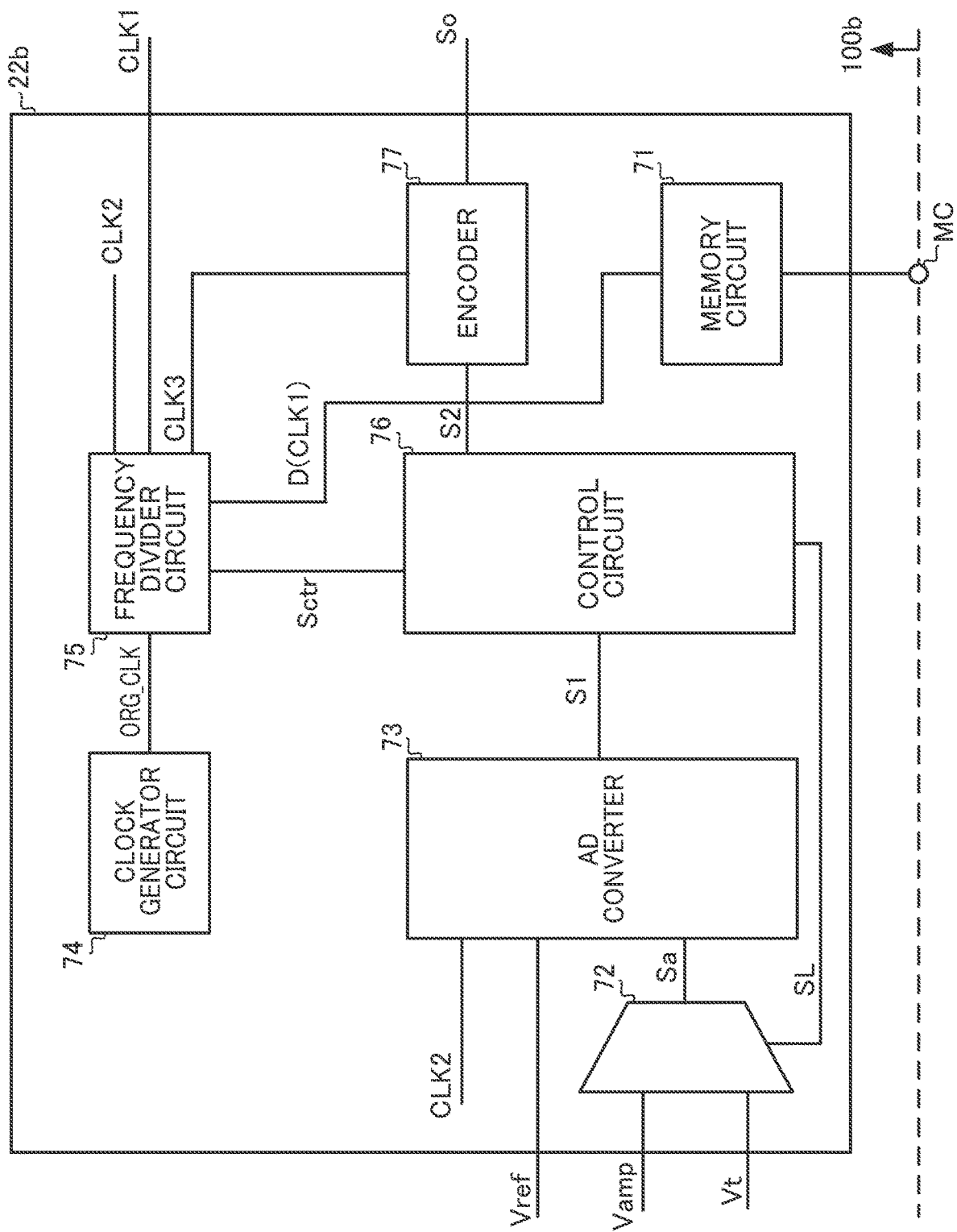
FIG. 6 illustrates a configuration example of a signal output circuit 22b according to a first embodiment.

FIG. 6 illustrates a configuration example of the signal output circuit 22b according to the first embodiment. The signal output circuit 22b includes a memory circuit 71, a selector circuit 72, an AD converter 73, a clock generator circuit 74, a frequency divider circuit 75, a control circuit 76, and an encoder 77.

The memory circuit 71 stores data D (CLK1) on a frequency of a clock signal CLK1 for operating a delay circuit (to be described later in FIG. 7) of the output circuit 23b.

The memory circuit 71 according to an embodiment of the present disclosure is a non-volatile memory such as a flash memory and the like. However, the memory circuit 71 may be a volatile register. In this case, the register may be incorporated in the control circuit 76.

The memory circuit 71 transmits and receives signals of an I2C communication standard through the terminal MC, thereby being able to communicate with an external circuit, device, or user. However, the communication standard is not limited to I2C, but external communication may be performed using another standard.

The memory circuit 71 stores the data D (CLK1) on the frequency of the clock signal CLK1 that is set from the outside through communication.

The selector circuit 72 selects one of the signals Vamp and Vt in response to a signal SL outputted from the control circuit 76, to output, to the AD converter 73, a resultant signal as a signal Sa. In other words, the selector circuit 72 outputs the signal Vamp, Vt as the signal Sa in a time-division manner.

The AD converter 73 converts the signal Sa, which is the output from the selector circuit 72, into a digital signal based on a reference voltage Vref and a clock signal CLK2, and outputs a resultant signal as a signal S1 to the control circuit 76. As a result, the AD converter 73 outputs the signal S1 including a signal indicating the temperature and a signal indicating the pressure.

The clock generator circuit 74 outputs a clock signal ORG_CLK serving as a reference to the frequency divider circuit 75. In other words, the clock signal ORG_CLK is a base clock to be frequency divided, and has a higher frequency than the clock signals CLK1 to CLK3.

The frequency divider circuit 75 frequency-divides the clock signal ORG_CLK, to thereby output the clock signals CLK1 to CLK3, based on the data D (CLK1).

Here, the clock signal CLK1 is a signal for operating a delay circuit included in the output circuit 23b, which will be described later with reference to FIG. 7. In other words, the frequency divider circuit 75 operates as a "clock signal output circuit" that outputs the clock signal CLK1 having the frequency stored in the memory circuit 71, based on the data D (CLK1).

The clock signal CLK2 is used when the AD converter 73 converts the signal Sa into the signal S1. The clock signal CLK3 is used when the encoder 77 performs an encoding process for the signal S2 to output the signal So of the SENT standard.

However, the clock signal output circuit may be provided independently for each of the clock signals CLK1 to CLK3. The clock signal output circuit does not have to be a circuit that generates the clock signals CLK1 to CLK3, based on one clock signal ORG_CLK, but may be a circuit provided outside the signal output circuit 22b.

The pressure sensor of the sensor 21 has a sensitivity changing with temperature. Thus, the control circuit 76 performs arithmetic processing to correct temperature characteristics of the sensor 21, to output a corrected signal S2.

The control circuit 76 reads a pressure data portion in the signal S1. The control circuit 76 also outputs a signal SL, to thereby control the selector circuit 72 so as to output a signal including data on temperature at predetermined intervals (e.g., several hundred microseconds). Accordingly, the control circuit 76 can correct the pressure data at predetermined intervals.

Further, the control circuit 76 may change the frequency of the clock signal CLK1 and/or the like based on the temperature detected by the sensor 21. The control circuit 76 outputs a signal Sctr to control the frequency, to the frequency divider circuit 75.

This makes it possible for the frequency divider circuit 75 to dynamically change the frequency of the signal CLK1 in response to the signal Sctr. In other words, the control circuit 76 according to an embodiment of the present disclosure can dynamically control, based on the temperature, an operation of the delay circuit of the output circuit 23b, which will be described later with reference to FIG. 8.

The encoder 77 performs a process of encoding the signal S2 based on the clock signal CLK3, to thereby output a signal So of the SENT standard. The signal So is outputted to the output circuit 23b.

The signal So includes a signal based on the pressure data obtained by making correction according to the temperature characteristics. Further, the signal So according to an embodiment of the present disclosure includes the temperature data detected by the temperature sensor. However, it is arbitrarily determined whether the signal So includes the data on the temperature itself.

The signal S1 corresponds to a "second digital signal". The signal S2 corresponds to a "third digital signal".

==Output Circuit 23b According to First Embodiment==

Figure 7:
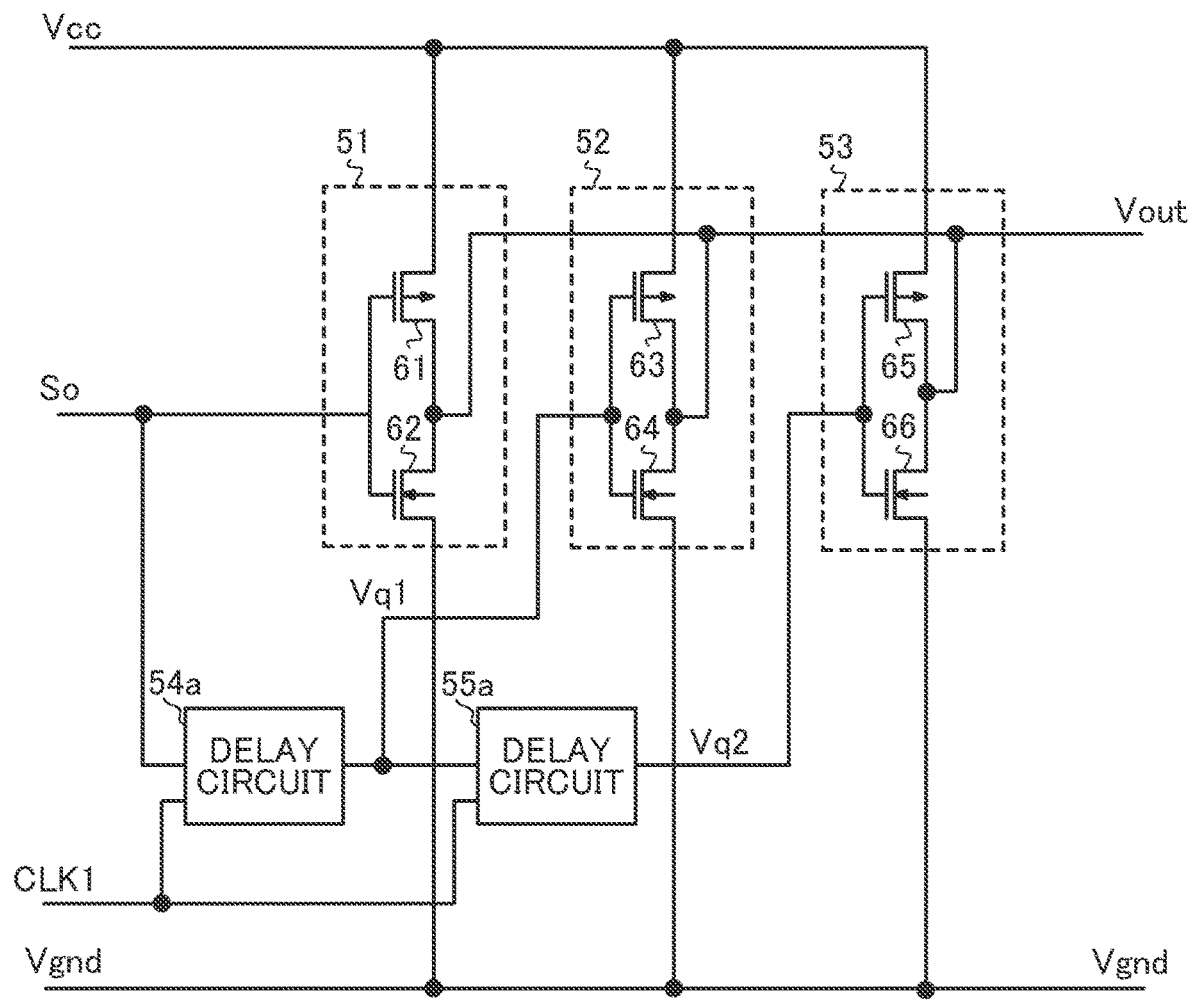
FIG. 7 illustrates a configuration example of an output circuit 23b according to a first embodiment.

FIG. 7 illustrates a configuration example of the output circuit 23b according to the first embodiment. The output circuit 23b includes buffer circuits 51 to 53 and delay circuits 54a and 55a.

In FIG. 7, parts or components that are the same as those of the output circuit 23a of FIG. 3 are given the same reference numerals.

However, the numbers of buffer circuits and delay circuits are not limited thereto. As long as the number of buffer circuits is two or more (i.e., n buffer circuits satisfying n≥2), and the number of delay circuits may be increased one by one with an increase in the number of buffer circuits (i.e., (n−1) delay circuits are provided).

The delay circuit 54a is a digital circuit that delays the signal So based on the clock signal CLK1 inputted thereto, to thereby output a resultant delayed signal as a signal Vq1 with respect to the signal So.

The buffer circuit 52 raises the voltage at the terminal OUT in response to a low signal Vq1, and lowers the voltage at the terminal OUT in response to a high signal Vq1.

The delay circuit 55a delays the signal Vq1 based on the inputted input clock signal CLK1, to thereby output a resultant signal as a signal Vq2 delayed with respect to the signal Vq1. In other words, the delay circuit 55a outputs the signal Vq2 obtained by delaying the signal So longer than in the case of the delay circuit 54a. The delay circuit 55a is implemented as a digital circuit same as delay circuit 54a.

The buffer circuit 53 raises the voltage at the terminal OUT in response to a low signal Vq2, and lowers the voltage at the terminal OUT in response to a high signal Vq2.

In an embodiment of the present disclosure, the current driving capability of the buffer circuit 51 that is driven first among the buffer circuits 51 to 53 is larger than that of the buffer circuit 52. Also, the current driving capability of the buffer circuit 52 is larger than that of the buffer circuit 53. Here, the "current driving capability" is determined by a sink current to lower the voltage across the load and a source current to raise the voltage across the load coupled to the terminal OUT through the output circuit 23b. However, the present disclosure is not limited thereto, and the current driving capability of the buffer circuit 51 may be smaller than that of the buffer circuits 52 and 53.

Here, the delay circuit 55a according to an embodiment of the present disclosure is coupled in series with the delay circuit 54a. With the delay circuit 55a being coupled in series with the delay circuit 54a, the signal can be delayed from the timing after a lapse of a delay period by which the delay circuit 54a has delayed the signal So.

Accordingly, when the signal So is delayed by using the delay circuits 54a and 55a coupled in series and the signal Vq2 is outputted, the configuration for the delay circuit 54a to delay the signal Vq1 with respect to the signal So in the delay circuit 55a can be omitted. This can reduce the circuit area of the delay circuit 55a.

However, the delay circuit 55a may be coupled in parallel with the delay circuit 54a. This makes it possible to change the design such that the signal Vq1 from the delay circuit 54a is delayed longer than the signal Vq2 from the delay circuit 55a, for example.

For example, it is possible to set current driving capability different among the buffer circuits and adjust the delay period among the buffer circuits under the circuit design conditions considering switching resistances of the buffer circuits 51 to 53 and their combined resistances, and the like.

The delay circuits 54a and 55a being designed to be coupled in parallel can improve the degree of freedom in circuit design.

The buffer circuit 51 corresponds to a "first buffer circuit", the buffer circuit 52 corresponds to a "second buffer circuit", and the buffer circuit 53 corresponds to a "third buffer circuit".

The low signal So corresponds to a "first digital signal of a first logic level", and the high signal So corresponds to a "first digital signal of a second logic level".

The delay circuit 54a corresponds to a "first digital delay circuit", and the delay circuit 55a corresponds to a "second digital delay circuit". The signal Vq1 corresponds to a "first delay signal", and the signal Vq2 corresponds to a "second delay signal".

===Delay Circuits 54a and 55a According to First Embodiment===

Figure 8:
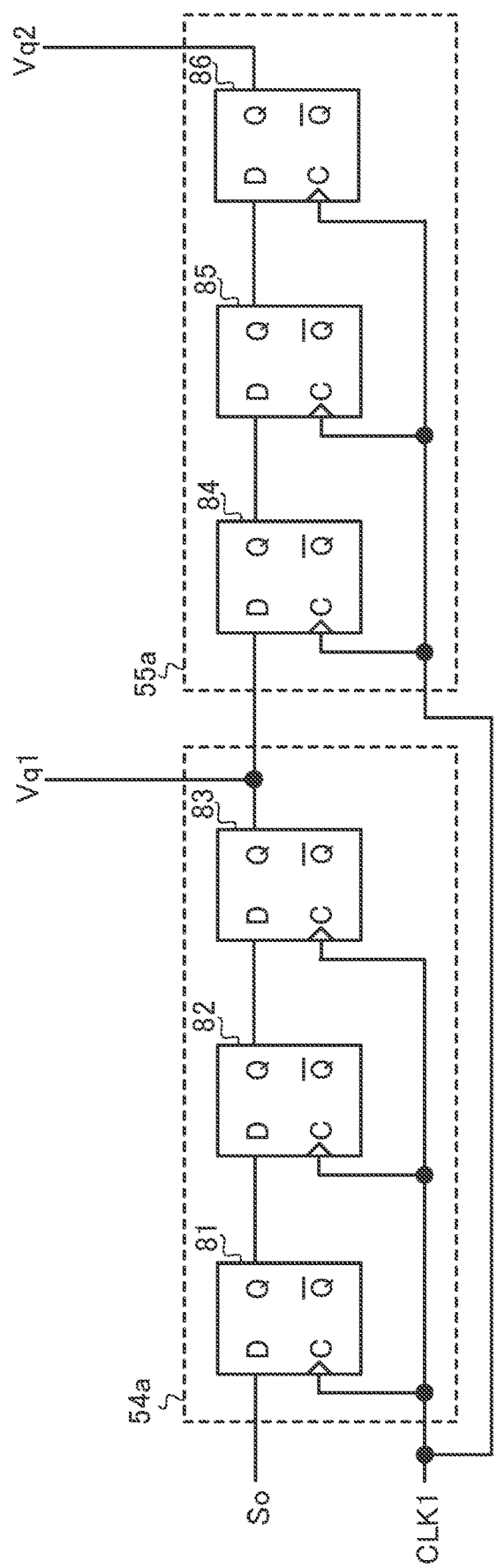
FIG. 8 illustrates a configuration example of delay circuits 54a and 55a according to a first embodiment.

FIG. 8 illustrates a configuration example of the delay circuits 54a and 55a according to the first embodiment. The delay circuit 54a includes flip-flops 81 to 83, and the delay circuit 55a includes flip-flops 84 to 86.

The delay circuit 54a is a shift register including three flip-flops 81 to 83 coupled in series, each of which receives a clock signal CLK1. The delay circuit 55a is a shift register including three flip-flops 84 to 86 coupled in series, each of which receives the clock signal CLK1.

In the delay circuit 55a according to an embodiment of the present disclosure, the same clock signal CLK1 as the clock signal CLK1 used in the delay circuit 54a is used as the clock signal to output the signal Vq2 obtained by delaying the signal So.

In the delay circuit 55a, the clock signal used to delay the signal Vq1 is not limited to the same clock signal as the clock signal CLK1 used for the delay in the delay circuit 54a. Under circuit design conditions such as the current driving capability of the buffer circuit 53, and/or the like, a clock signal different from that used in the delay circuit 54a may be used to output the signal Vq2.

Further, the number of flip-flops in the shift register is not limited to three, and a shift register including any number of one or more flip-flops according to a desired delay period in the signals Vq1 and Vq2 may be used. The number of stages of the flip-flops in the shift register of the delay circuit 55a may be different from that of the delay circuit 54a.

As has been described above, in an embodiment of the present disclosure, the buffer circuit 51 that operates in response to the signal So and the buffer circuits 52 and 53 that operate in response to the delayed signals Vq1 and Vq2, respectively, are operated in combination.

Thus, in the output circuit 23b, the buffer circuits 51 to 53 operate at different timings. As a result, the output circuit 23b causes the voltage Vout applied to the terminal OUT to change over time more gradually than the output circuit 23a.

The change in the current supplied to the terminal OUT from the buffer circuits 51 to 53 is smaller than that in a case where the buffer circuits 51 to 53 are operated at the same timing. As a result, a slew rate of the signal outputted from the output circuit 23b decreases.

Reduction in the change in the current supplied to the terminal OUT mitigates the influence of spike noise on the signal Vamp. The following specifically describes this with reference to changes in the voltage Vout with time.

==Timing Diagram of Signals in Output Circuit 23b According to Embodiment==

Figure 9:
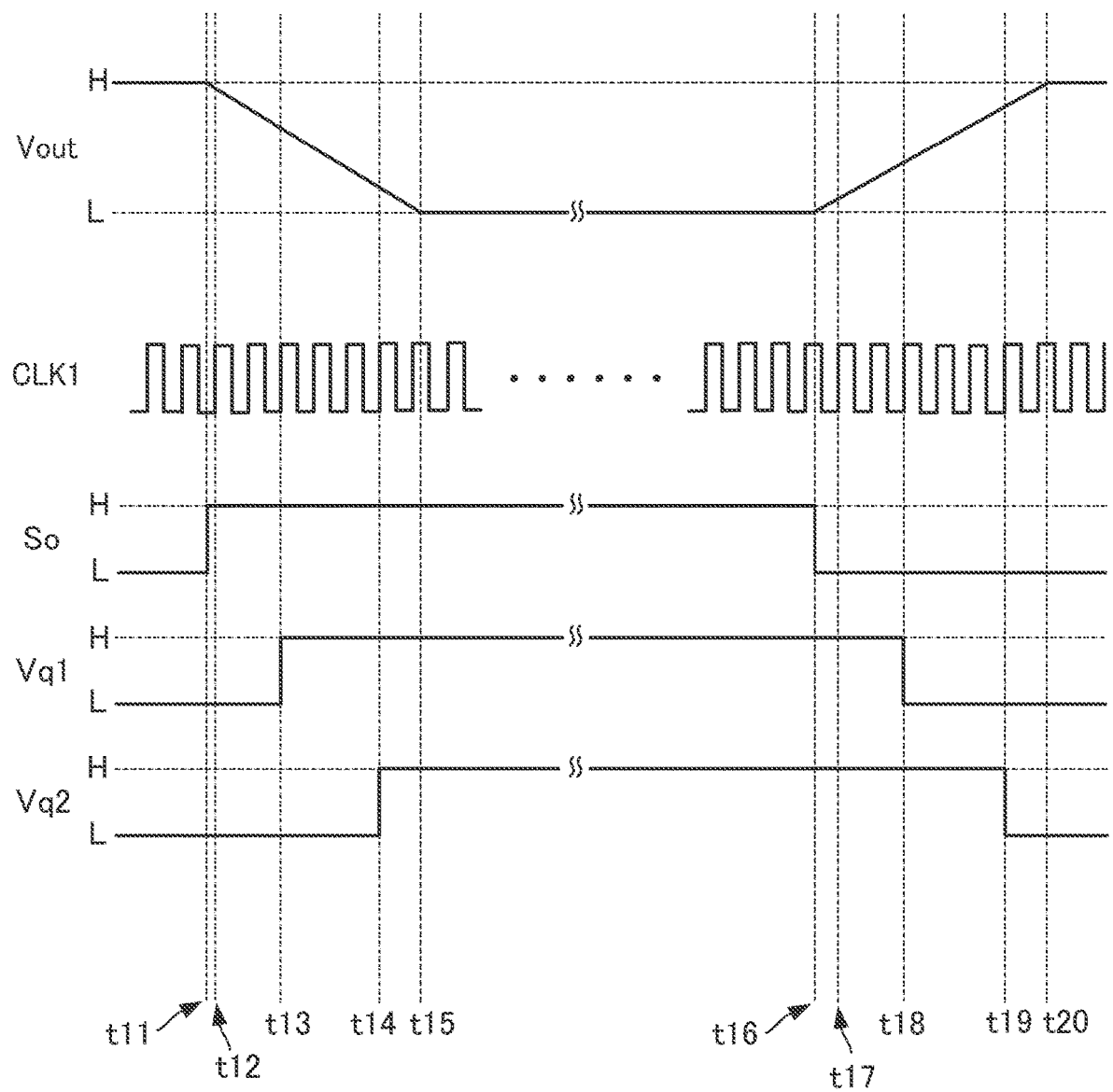
FIG. 9 illustrates an example of a timing diagram of a signal So, a voltage Vout, a clock signal CLK1, and signals Vq1 and Vq2.

FIG. 9 illustrates an example of a timing diagram of the signal So, the voltage Vout, the clock signal CLK1, and the signals Vq1 and Vq2.

Until time t11, the signal output circuit 22b of FIG. 6 outputs a low signal So to the output circuit 23b. Then, at time t11, the signal output circuit 22b changes the signal So to high.

Until time t11, the buffer circuits 51 to 53 of FIG. 7 apply a high voltage Vout to the terminal OUT in response to low signals So, Vq1, and Vq2. At time t11, the buffer circuit 51 in the first stage lowers the voltage Vout applied to the terminal OUT in response to the change in the signal So to high.

In this event, the PMOS transistor 63 in the buffer circuit 52 in the second stage and the PMOS transistor 65 in the buffer circuit 53 in the third stage are on. Accordingly, as compared with the case where the buffer circuits 51 to 53 operates at the same timing as illustrated in FIG. 4, for example, the voltage Vout changes gradually in FIG. 9.

After time t11, the flip-flop 81 of FIG. 8 changes the logic level of the signal outputted from a Q terminal to high at the timing at which the clock signal CLK1 changes to high next. In other words, at time t12, the flip-flop 81 changes the signal outputted from the Q terminal to high.

After time t12, the flip-flop 82 changes the signal outputted from the Q terminal to high at the timing at which the clock signal CLK1 changes to high next (after one cycle of the clock signal CLK1 from time t11).

Likewise, the flip-flop 83 changes the signal Vq1 outputted from the Q terminal to high at time t13, which is the timing after two cycles of the clock signal CLK1 from time t12.

Accordingly, the delay circuit 54a outputs a signal Vq1 that changes to high at time t13. The Q terminals of the flip-flops 81 to 83 correspond to "output terminals" of the flip-flops 81 to 83.

At time t13, the buffer circuit 52 lowers the voltage Vout applied to the terminal OUT in response to the change in the signal Vq1 to high.

In this event, the PMOS transistor 65 of the buffer circuit 53 in the third stage is on. Accordingly, in this case as well, the voltage Vout changes gradually in FIG. 9 as compared with the case where the buffer circuits 51 to 53 operate at the same timing as illustrated in FIG. 4.

Although the slope of the voltage Vout from time t11 to time t13 and the slope of the voltage Vout after time t13 are given by the straight line in FIG. 9, those are merely schematically illustrated. In other words, since the buffer circuit 52 lowers the voltage Vout at the terminal OUT to low from time t13, the slope of the voltage Vout may change at time t13 depending on the resistances and/or the current driving capabilities of the buffer circuits 51 to 53.

In response to the high signal Vq1 being inputted to the delay circuit 55a at time t13, the logic level of the signal outputted from the Q terminal of the flip-flop 84 changes to high after one cycle of the clock signal CLK1 from time t13.

The flip-flops 85 and 86 operate same as the flip-flop 84. Accordingly, at time t14 (after three cycles of the clock signal CLK1 from time t13), the flip-flop 86 changes the logic level of the signal Vq2 outputted from the Q terminal to high.

At time t14, the buffer circuit 53 lowers the voltage Vout applied to the terminal OUT, in response to the change in the signal Vq2 to high.

The output circuit 23*b* as a whole lowers the voltage Vout to be outputted, over a time period up to time t15. As a result, the output circuit 23*b* gradually lowers the voltage Vout to low over a time period from time t11 to time t15.

Thereafter, the signal output circuit 22*b* continues to output the high signal So until time t16. The signal output circuit 22*b* then changes the logic level of the signal So to low at time t16.

At time t16, the buffer circuit 51 raises the voltage Vout applied to the terminal OUT, in response to the change in the signal So to low.

The flip-flop 81 in FIG. 8 changes the logic level of the signal outputted from the Q terminal to low at time t17 (the timing at which the clock signal CLK1 changes to high next after time t16). At time t18 (after two cycles of the clock signal CLK1 from time t17), the delay circuit 54*a* changes the signal Vq1 to be outputted to low.

As such, the delay circuit 54*a* shifts the signal So, based on the clock signal CLK1, to output a resultant signal as the signal Vq1.

At time t18, the buffer circuit 52 raises the voltage Vout applied to the terminal OUT, in response to the change in the signal Vq1 to low.

Further, at time t19 (after three cycles of the clock signal CLK1 from time t18), the flip-flop 86 changes the logic level of the signal Vq2 outputted from the Q terminal to low.

The delay circuit 55*a* shifts the signal Vq1 by three cycles of the clock signal CLK1, based on the clock signal CLK1, to output a resultant signal as the signal Vq2.

As has been described above, in the output circuit 23*b*, the delay periods of the signals Vq1 and Vq2 outputted by the delay circuits 54*a* and 55*a* with respect to the signal So is based on the period of the clock signal CLK1 and the number of stages of the flip-flops in the delay circuits 54*a* and 55*a*.

Accordingly, in the delay circuits 54*a* and 55*a*, the delay periods can be adjusted with high accuracy with the period of the clock signal CLK1 by changing the number stages of the flip-flops.

Further, at time t19, the buffer circuit 53 raises the voltage Vout applied to the terminal OUT, in response to the change in the signal Vq2 to low.

The output circuit 23*b* as a whole raises the voltage Vout to be outputted, over a time period up to time t20. As a result, the output circuit 23*b* gradually raises the voltage Vout to high over a time period from time t16 to time t20.

Next, a relationship among the signal So, the voltage Vout, and a noise generated in the signal Vamp will be described.

==Influence of Voltage Vout on Signal Vamp in Integrated Circuit 100*b*==

Figure 10:
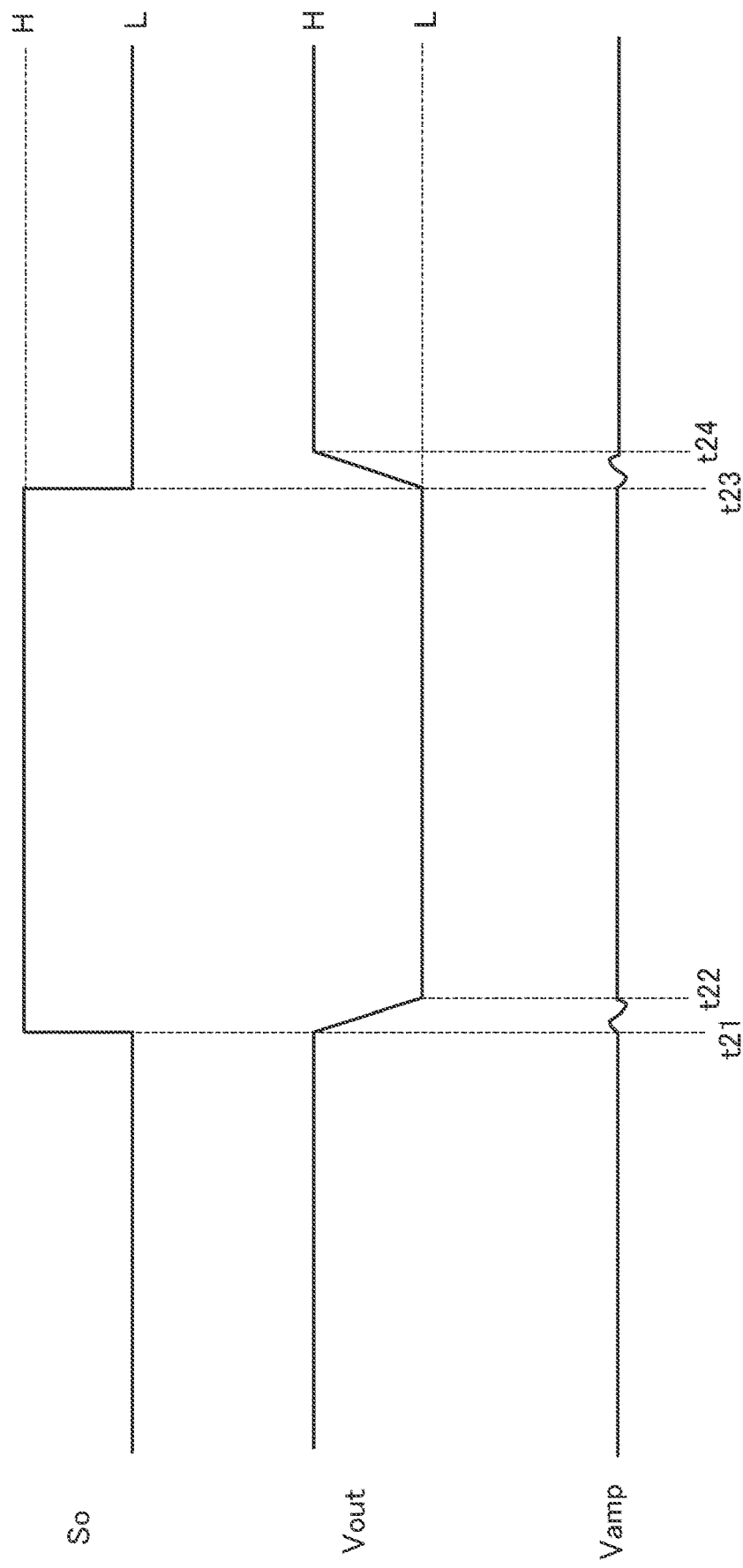
FIG. 10 is an example of a conceptual diagram illustrating a relationship among a signal So inputted to an output circuit 23b, a voltage Vout, and a noise generated in a signal Vamp outputted from a sensor 21.

FIG. 10 is an example of a conceptual diagram illustrating a relationship among the signal So inputted to the output circuit 23*b*, the voltage Vout, and a noise generated in the signal Vamp outputted from the sensor 21.

Until time t21, the signal output circuit 22*b* of FIG. 6 outputs a low signal So to the output circuit 23*b*. The output circuit 23*b* of FIG. 7 applies a high voltage Vout to the terminal OUT during this time period.

At time t21, the signal output circuit 22*b* changes the signal So, which is to be outputted to the output circuit 23*b*, to high.

As has been already described with reference to FIG. 9, after t21, the buffer circuits 51 to 53 gradually lower the voltage Vout applied to the terminal OUT. As a result, the output circuit 23*b* gradually lowers the voltage Vout applied to the terminal OUT, over a time period from time t21 to time t22.

This is because when transmitting a signal from the output circuit 23*b* to the microcomputer 200, the integrated circuit 100 transmits the signal with low slew rate compared with a case where the logic level of the signal is changed instantaneously at time t21. The slew rate is lowered within a range in which the requirements for the slew rate of the SENT standard is satisfied.

As a result, the logic level of the voltage Vout in the output circuit 23*b* of FIG. 7 changes over a long time period as compared with the change in the logic level of the voltage Vout in the output circuit 23*a* of FIG. 3.

In this case, a noise generated in the voltage Vamp in the output circuit 23*b* is smaller than a spike noise in the voltage Vamp of the output circuit 23*a*.

Accordingly, the output circuit 23*b* can reduce the generation of noise in the voltage Vamp caused by the change in the logic level of the voltage Vout.

At time t23, the signal output circuit 22*b* changes the signal So inputted to the output circuit 23*b* to low. In accordance therewith, the buffer circuits 51 to 53 included in the output circuit 23*b* gradually raises the voltage Vout applied to the terminal OUT.

Thus, the output circuit 23*b* changes the level of the signal Vout to high over a time period from time t23 to time t24. In this case as well, the logic level of the voltage Vout of the output circuit 23*b* changes over a long time period as compared with the change in the output circuit 23*a*.

Accordingly, the noise generated in the voltage Vamp in the output circuit 23*b* is smaller than the spike noise in the voltage Vamp in the output circuit 23*a*. As a result, the output circuit 23*b* can reduce the generation of noise in the voltage Vamp caused by the change in the logic level of the voltage Vout.

In the buffer circuits 51 to 53 of the output circuit 23*b*, on/off states of all the inverters in parallel are the same among a time period before time t21, a time period from time t22 to time t23, and a time period after time t24.

Accordingly, during these time periods, the buffer circuits 51 to 53 exhibit stability in electromagnetic susceptibility (EMS) performance. In other words, the output circuit 23*b* according to an embodiment of the present disclosure has excellent noise immunity in both electromagnetic interference (EMI) and EMS performance.

<<Integrated Circuit 100*c* According to Second Embodiment>>

Figure 11:
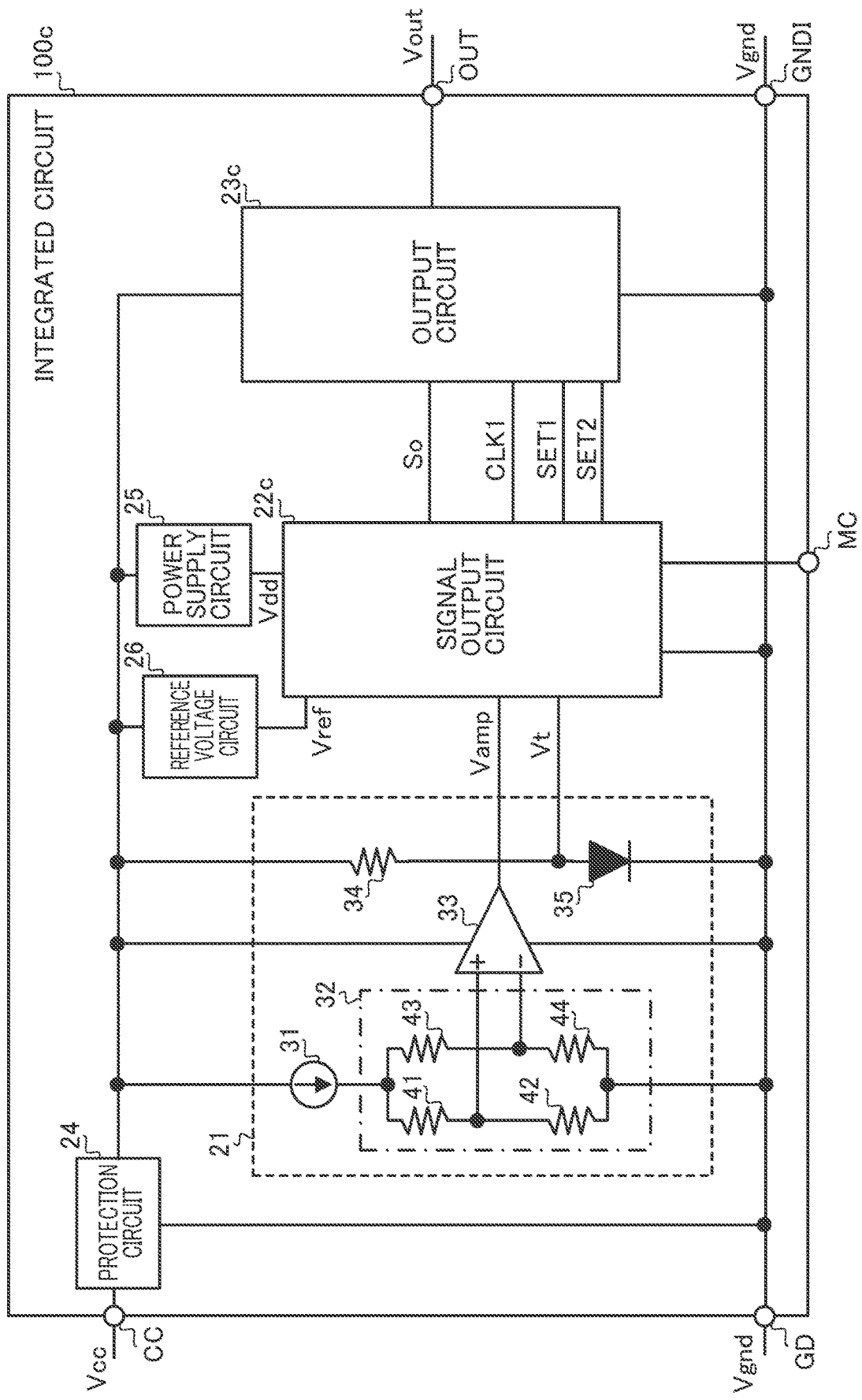
FIG. 11 illustrates a configuration example of an integrated circuit 100c according to a second embodiment.

FIG. 11 illustrates a configuration example of an integrated circuit 100*c* according to a second embodiment. The following mainly describes differences between the integrated circuit 100*c* according to the second embodiment and the integrated circuit 100*b* according to the first embodiment. In FIG. 11, parts or components that are the same as those in the integrated circuit 100*b* of FIG. 5 are given the same reference numerals.

The integrated circuit 100*c* includes a sensor 21, a signal output circuit 22*c*, an output circuit 23*c*, a protection circuit 24, a power supply circuit 25, a reference voltage circuit 26, and terminals CC, GD, OUT, GNDI, and MC. In other words, the integrated circuit 100*c* is different from the integrated circuit 100b in including the signal output circuit 22c and the output circuit 23c.

The signal output circuit 22c outputs signals SET1 and SET2 to the output circuit 23c in addition to a signal So and a clock signal CLK1.

==Configuration of Signal Output Circuit 22c According to Second Embodiment==

Figure 12:
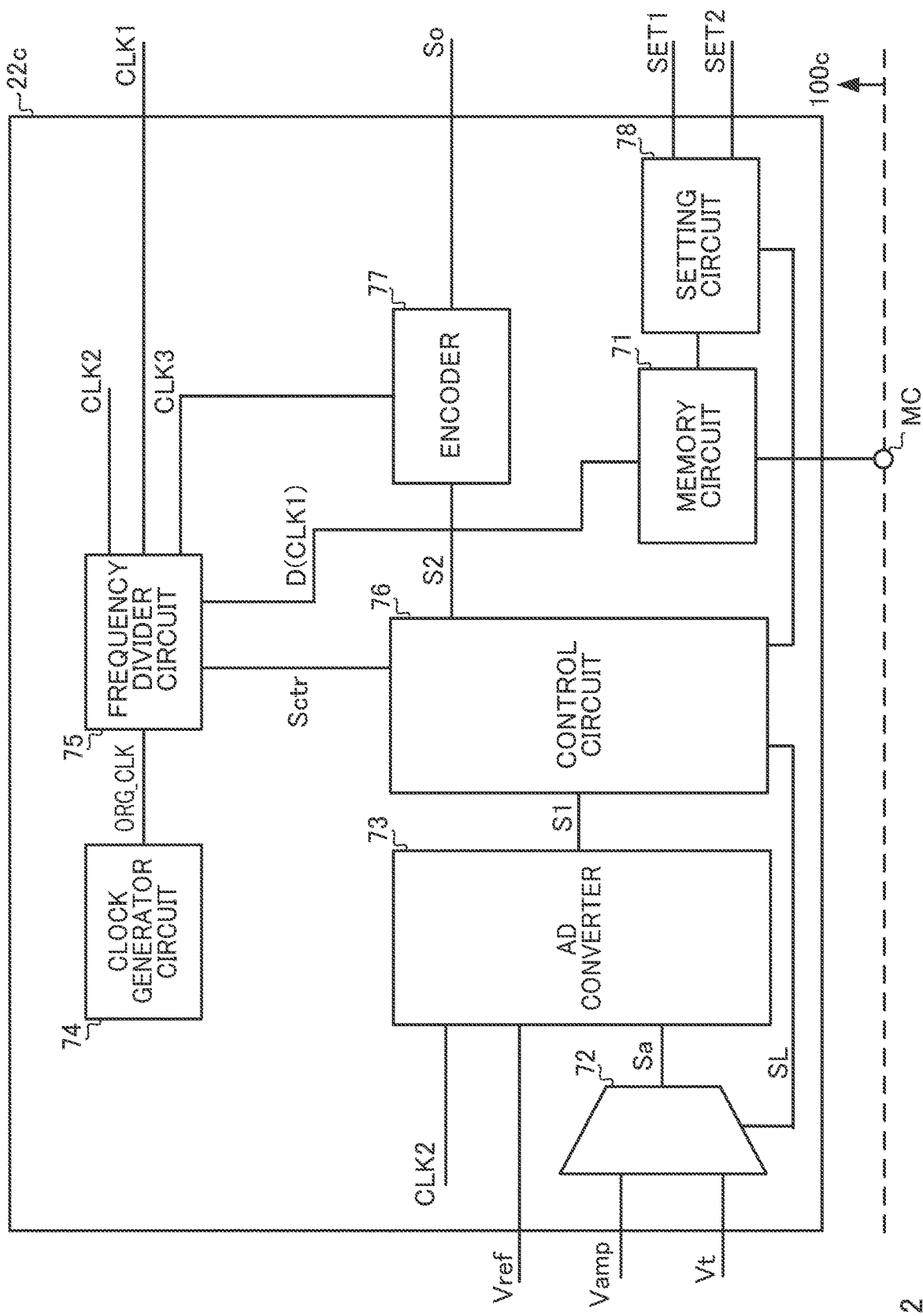
FIG. 12 illustrates a configuration example of a signal output circuit 22c according to a second embodiment.

FIG. 12 illustrates a configuration example of the signal output circuit 22c according to the second embodiment. In FIG. 12, parts or components that are the same as those of the signal output circuit 22b of FIG. 6 are given the same reference numerals.

The signal output circuit 22c includes a memory circuit 71, a selector circuit 72, an AD converter 73, a clock generator circuit 74, a frequency divider circuit 75, a control circuit 76, an encoder 77, and a setting circuit 78. The signal output circuit 22c is different from the signal output circuit 22b in including the setting circuit 78.

The memory circuit 71 according to an embodiment of the present disclosure stores setting information for setting a delay period of delay circuit 54b, 55b, which will be described later in FIGS. 13 and 14. The setting information stored in the memory circuit 71 is rewritable by an external circuit, device, or user transmitting and receiving an I2C communication standard signal through the terminal MC.

Figure 13:
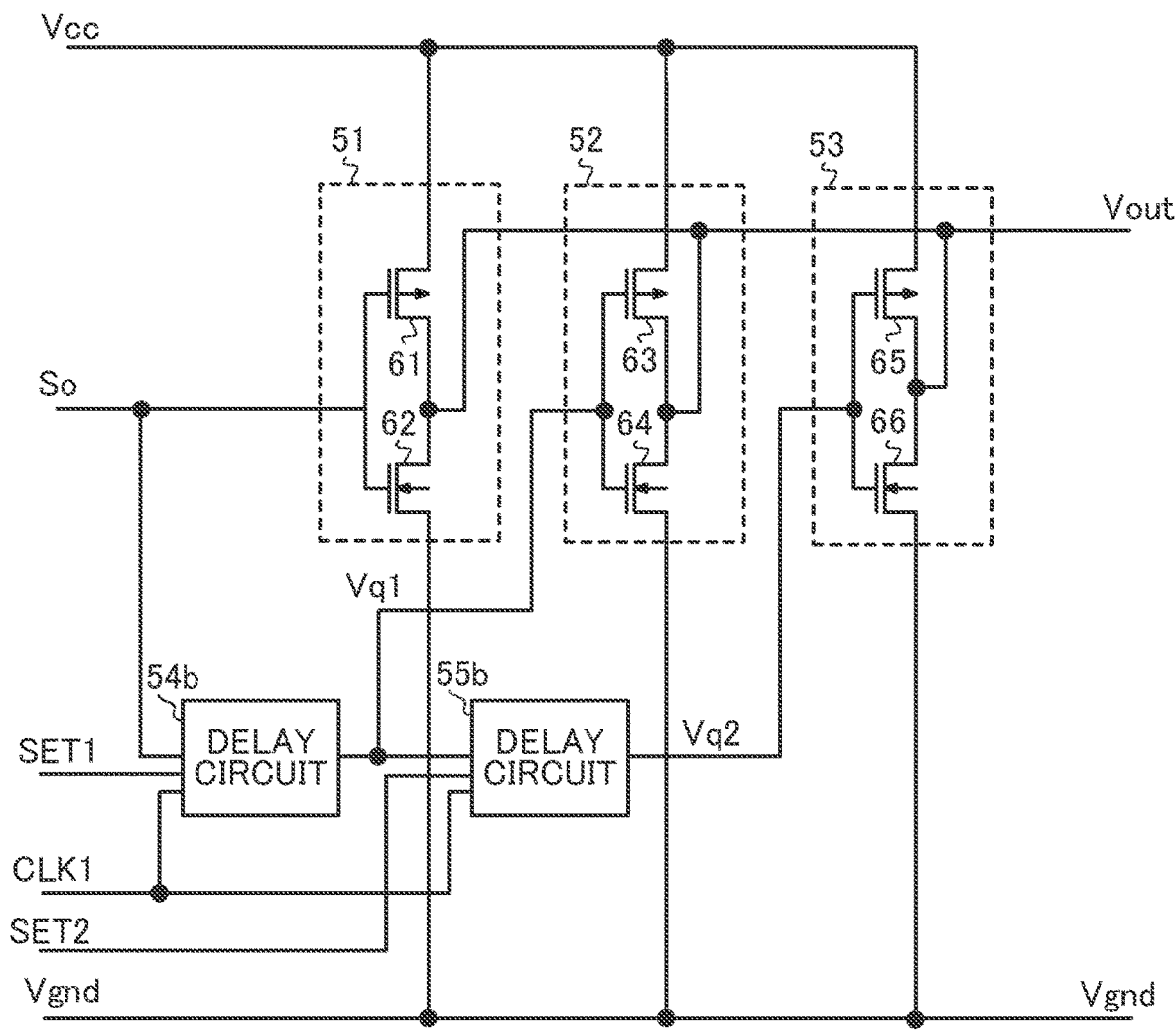
FIG. 13 illustrates a configuration example of an output circuit 23c according to a second embodiment.

The setting circuit 78 outputs the signal SET1 to the delay circuit 54b and outputs the signal SET2 to the delay circuit 55b, based on the setting information on the delay period stored in the memory circuit 71 (see FIG. 13).

Here, the control circuit 76 according to an embodiment of the present disclosure can causes the setting circuit 78 to change the setting of the delay period, based on a temperature detected by the sensor 21. This makes it possible for the control circuit 76 according to an embodiment of the present disclosure to dynamically change both settings of the delay period and the clock signal CLK1 for the delay circuits 54b, 55b, based on the temperature.

Thus, in the signal output circuit 22c, the delay period of the delay circuit 54b, 55b is controlled more precisely. Accordingly, the integrated circuit 100c can more precisely control a slew rate of a signal outputted from the output circuit 23c, according to driving capabilities of buffer circuits 51 to 53, and the like.

==Configuration of Output Circuit 23c According to Second Embodiment==

FIG. 13 illustrates a configuration example of the output circuit 23c according to the second embodiment. The output circuit 23c includes the buffer circuits 51 to 53 and the delay circuits 54b and 55b. In FIG. 13, parts or components that are the same as those in the output circuit 23b of FIG. 7 are given the same reference numerals.

The setting circuit 78 of FIG. 12 outputs the signal SET1 to the delay circuit 54b, and outputs the signal SET2 to the delay circuit 55b.

In other words, the delay circuit 54b according to an embodiment of the present disclosure shifts the signal So to output a signal Vq1 to the buffer circuit 52, based on the clock signal CLK1 and the signal SET1. Similarly, the delay circuit 55b shifts the signal Vq1 to output a signal Vq2 to the buffer circuit 53, based on the clock signal CLK1 and the signal SET2.

Figure 14:
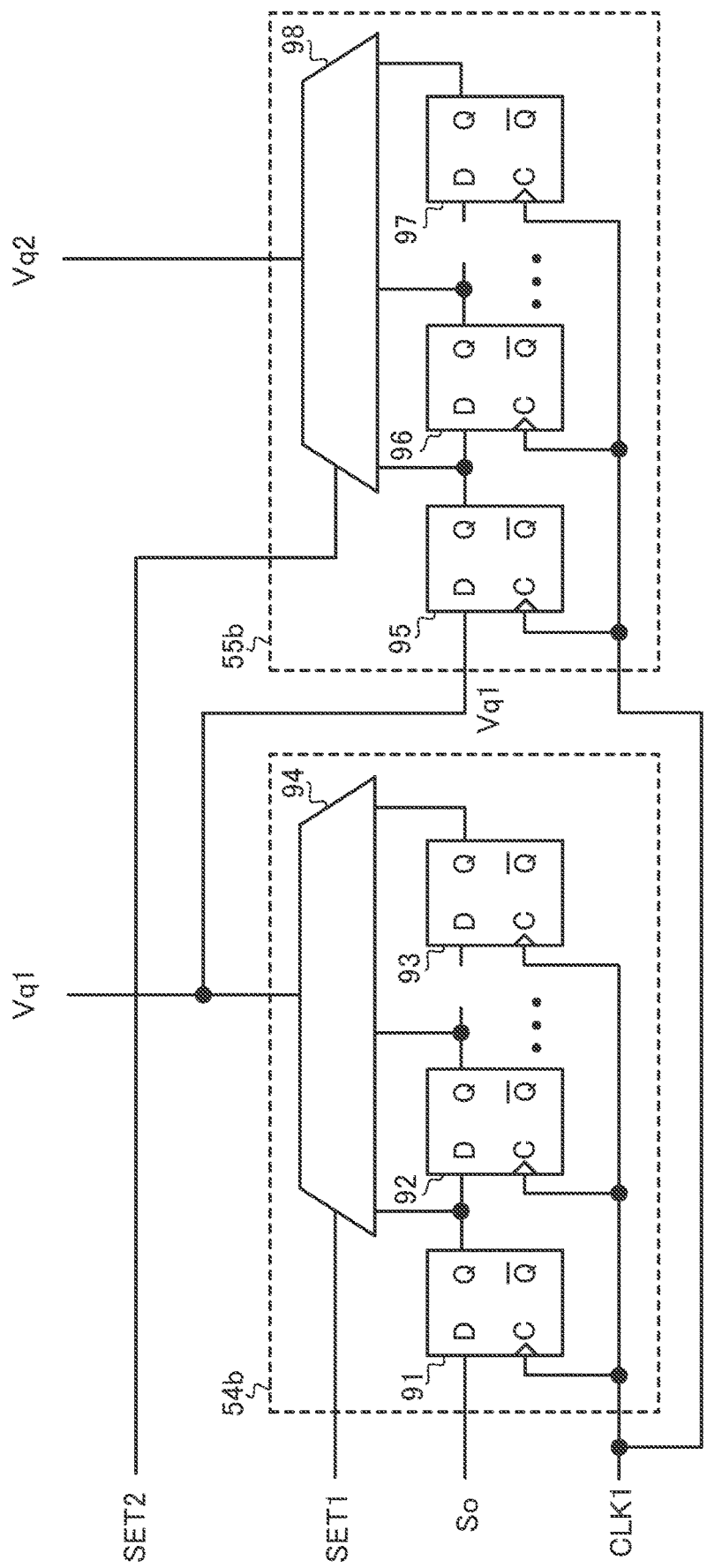
FIG. 14 illustrates a configuration example of delay circuits 54b and 55b according to a second embodiment.

With reference to FIG. 14, a description will be given of how the delay period is set in response to the signals SET1 and SET2 in the delay circuits 54b and 55b.

==Configuration of Delay Circuits 54b and 55b According to Second Embodiment==

FIG. 14 illustrates a configuration example of the delay circuits 54b and 55b according to the second embodiment.

The delay circuit 54b includes flip-flops 91 to 93 and a selector circuit 94. The delay circuit 55b includes flip-flops 95 to 97 and a selector circuit 98.

The delay circuit 54b is a shift register including a plurality of flip-flops 91 to 93 coupled in series. In an embodiment of the present disclosure, the delay circuit 54b includes a plurality of flip-flops between the flip-flops 92 and 93.

The selector circuit 94 is coupled to Q terminals (output terminals) of the flip-flops included in the delay circuit 54b and to the buffer circuit 52. The selector circuit 94 selects which output of the Q terminals is to be outputted to the buffer circuit 52 as a signal Vq1, in response to the signal SET1.

The number of flip-flops in the delay circuit 54b may be any number as long as two or more. In other words, it suffices that the selector circuit 94 can select any from the outputs of Q terminals of the plurality of flip-flops as the signal Vq1 to be outputted.

The more stages of flip-flops the inputted input signal So is shifted to the output of the Q terminal selected by the selector circuit 94 through, the more the delay period of the signal Vq1 with respect to the signal So increases.

In other words, the delay period of the signal Vq1 with respect to the signal So is based on the clock signal CLK1 and the number of stages of flip-flops through which the signal So is shifted to the selected output of the Q terminal.

The selector circuit 94 outputs the signal Vq1 also to the delay circuit 55b.

The delay circuit 55b is also a shift register including a plurality of flip-flops 95 to 97 coupled in series. The number of the flip-flops included in the delay circuit 55b may also be any number as long as there is two or more flip-flops.

The selector circuit 98 is coupled to Q terminals (output terminals) of the flip-flops included in the delay circuit 55b and to the buffer circuit 53. The selector circuit 98 selects which output of the Q terminals is to be outputted to the buffer circuit 53 as a signal Vq2, in response to the signal SET2.

The selector circuit 94 corresponds to a "first selector circuit", and the selector circuit 98 corresponds to a "second selector circuit".

==Configuration of Delay Circuits 54c and 55c according to Third Embodiment==

Figure 15:
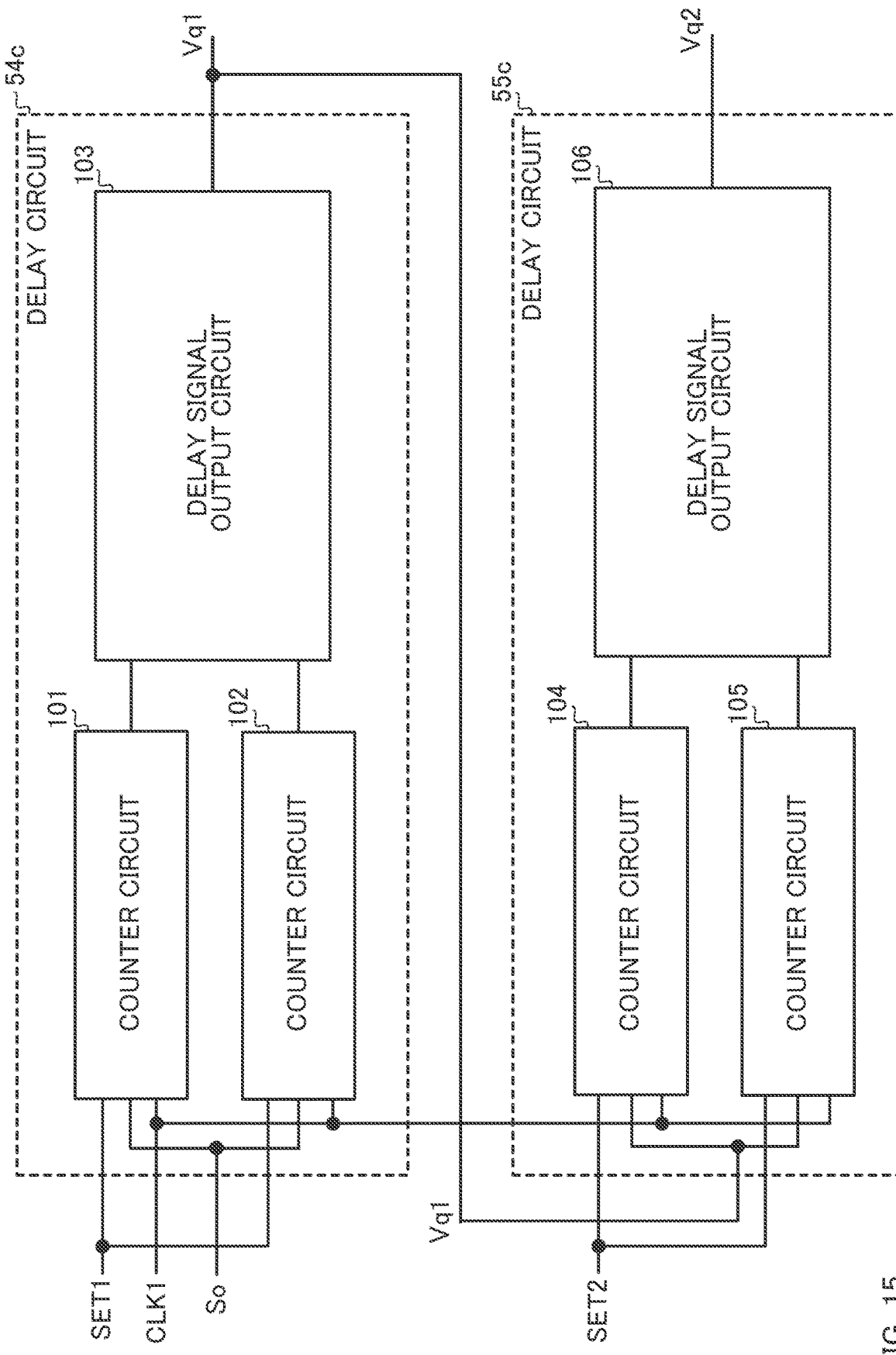
FIG. 15 illustrates a configuration example of delay circuits 54c and 55c according to a third embodiment.

FIG. 15 illustrates a configuration example of delay circuits 54c and 55c according to a third embodiment. An output circuit 23c according to an embodiment of the present disclosure has the same configuration except that the delay circuits 54b and 55b in FIG. 13 are replaced with the delay circuits 54c and 55c.

The delay circuit 54c includes counter circuits 101 and 102 and a delay signal output circuit 103. The delay circuit 55c also includes counter circuits 104 and 105 and a delay signal output circuit 106. The delay circuit 55c according to an embodiment of the present disclosure is coupled in series with the delay circuit 54c.

===Configuration of Delay Circuit 54c===

The counter circuit 101 detects a rising edge of a signal So, to delay the rising edge based on a clock signal CLK1. A delay period by which the counter circuit 101 delays the rising edge is set to a predetermined time period based on the clock signal CLK1 and a signal SET1.

In other words, in response to the signal So changing from low to high, the counter circuit 101 counts the delay period, to delay the rising edge of the signal So.

The counter circuit 102 detects a falling edge of the signal So, to delay the falling edge. A delay period by which the counter circuit 102 delays the falling edge is set based on the clock signal CLK1 and the signal SET1, and is the same period as the time period by which the counter circuit 101 delays the rising edge.

In other words, in response to the signal So changing from high to low, the counter circuit 102 counts the predetermined delay period to delay the falling edge of the signal So.

The delay signal output circuit 103 outputs a signal Vq1 having the rising edge delayed by the counter circuit 101 and the falling edge delayed by the counter circuit 102. In other words, the delay signal output circuit 103 outputs the signal Vq1 obtained by delaying the signal So, based on the count result from the counter circuit 101 and the count result from the counter circuit 102.

===Configuration of Delay Circuit 55c===

The delay circuit 55c includes counter circuits 104 and 105 and a delay signal output circuit 106.

In the delay circuit 55c as well, the counter circuit 104 counts a delay period, to delay a rising edge of a signal Vq1 in response to the signal Vq1 changing from low to high. The counter circuit 105 counts a predetermined delay period, to delay a falling edge of the signal Vq1 in response to the signal Vq1 changing from high to low.

The delay signal output circuit 106 outputs a signal Vq2 obtained by delaying the signal Vq1, based on the count result from the counter circuit 104 and the count result from the counter circuit 105.

In an embodiment of the present disclosure, the delay circuit 55c is coupled in series with the delay circuit 54c, but the present disclosure is not limited thereto. Here, with the delay circuit 55c being coupled in series with the delay circuit 54c, the signal Vq1 can be delayed with respect to the timing after a lapse of the delay period by which the signal So has been delayed.

Unlike the delay circuit including the shift register, the delay circuits 54c and 55c only have to extend the count period of the counter circuits 101, 102, 104, and 105 to increase the delay period. It is not needed to use many flip-flops even though the delay period increases.

Accordingly, even when the delay circuits 54c and 55c are provided in parallel, the circuit area does not increase significantly.

With the delay circuit 55c being provided in parallel with the delay circuit 54c, it is possible to change the design such that the signal Vq1 from the delay circuit 54c is delayed longer than the signal Vq2 from the delay circuit 55c, when it is desired or the like. This makes it easier to set the current driving capabilities that are different among the buffer circuits and design the delay periods of the delay circuits 54c and 55c according thereto.

With the delay circuits 54c and 55c are provided in parallel as such, the degree of freedom in circuit design can be improved. In other words, the delay circuit 55c may be coupled in series with or in parallel with the delay circuit 54c.

The counter circuit 102 corresponds to a "first counter circuit", and the counter circuit 101 corresponds to a "second counter circuit".

===Summary===

Provided is the integrated circuit 100b, 100c comprising the signal output circuit 22b or 22c configured to output the signal So in response to the signals Vamp and Vt; the buffer circuit 51 configured to raise the voltage Vout in response to the low signal So, and lower the voltage Vout in response to the high signal So; the delay circuit 54a, 54b configured to output the signal Vq1 based on the clock signal CLK1; and the buffer circuit 52 configured to raise the voltage Vout in response to the low signal Vq1, and lower the voltage Vout in response to the high signal Vq1.

This causes the delay circuit 54a, 54b to operate the buffer circuits 51 and 52 at different timings. With the buffer circuits 51 and 52 operating at different timings, the voltage Vout applied to the terminal OUT is gradually changed over time, to thereby reduce a change in the current supplied to the terminal OUT.

Accordingly, in the integrated circuit 100b, 100c, the slew rate of the signal outputted from the output circuit 23b, 23c is reduced, to thereby reduce the generation of noise when the buffer circuit 51, 52 changes the output. According to an embodiment of the present disclosure, the integrated circuit 100b, 100c having excellent noise immunity in both EMI and EMS performance can be provided.

The integrated circuit 100b, 100c further includes the memory circuit 71 configured to store the frequency of the clock signal CLK1; and the frequency divider circuit 75 configured to output the clock signal CLK1 having the frequency stored in the memory circuit 71.

This makes it possible for the frequency divider circuit 75 to generate the clock signal CLK1 that defines the delay period of the delay circuit 54a, 54b, based on the frequency stored in the memory circuit 71 that can be set afterward through external communication.

In the integrated circuit 100b, 100c, the delay circuit 54a, 54b is a shift register configured to shift the signal So, to output a resultant signal, based on the clock signal CLK1.

This makes it possible for the delay circuit 54a, 54b to set the delay period based on the clock signal CLK1 and the number of stages of the shift registers.

In the integrated circuit 100c, the memory circuit 71 stores the setting information to set the delay period of the delay circuit 54b, and the delay circuit 54b includes the selector circuit 94 that couple the buffer circuit 52 and the Q terminal selected based on the setting information from among the Q terminals of the flip-flops 91 to 93.

This makes it possible for the selector circuit 94 to select how many stages of the flip-flops corresponding to the delay period to be set according to the delay period stored in the memory circuit 71. Accordingly, the delay circuit 54b can precisely set the delay period between the buffer circuits 51 and 52 afterward.

Further, in the integrated circuit 100c, the memory circuit 71 stores the setting information to set the delay period of the delay circuit 54c, and the delay circuit 54c includes the counter circuit 102 configured to count the delay period based on the clock signal CLK1, in response to the signal So going low, the counter circuit 101 configured to count the delay period based on the clock signal CLK1, in response to the signal So going high, and the delay signal output circuit 103 configured to output the signal Vq1 based on the count results of the counter circuits 101 and 102.

This makes it possible for the delay circuit 54c to set a different delay period afterward according to the delay period stored in the memory circuit 71. According to an embodiment of the present disclosure, it suffices that the count period of the counter is extended, unlike the delay circuit including the shift register, and it is not necessary to use many flip-flops even though the delay period is increased. Thus, the circuit area can be reduced.

The integrated circuit 100b, 100c includes the sensor 21 configured to detect a physical quantity, to output the analog signal Vamp, Vt corresponding to the physical quantity to the signal output circuit 22b, 22c.

Thus, the sensor 21 is provided, which has less influence of noise when the buffer circuit 51, 52 changes the output on the sensor data.

In the integrated circuit 100b, 100c, the sensor 21 includes a pressure sensor and a temperature sensor, and the signal output circuit 22b, 22c includes the selector circuit 72 configured to output the signal Vamp and the signal Vt in a time-division manner, the AD converter 73 configured to convert an output from the selector circuit 72, to output a resultant signal as a signal S1, the control circuit 76 configured to output a signal S2 obtained by correcting the pressure data in the signal S1 based on the temperature, and control the selector circuit 72, and the encoder 77 configured to encode the signal S2 to thereby obtain a signal So of SENT standard.

This makes it possible to provide a pressure sensor that has less influence of noise on the pressure data when the buffer circuit 51, 52 changes the output, and that has the temperature characteristics corrected with respect to the pressure data.

The integrated circuit 100b, 100c further includes the delay circuit 55a, 55b configured to output the signal Vq2 based on the clock signal CLK1, and the buffer circuit 53 configured to raise the voltage Vout at the terminal OUT in response to the low signal Vq2, and lower the voltage Vout at the terminal OUT in response to the high signal Vq2.

This makes it easier, in the integrated circuit 100b, 100c, to provide a sufficient current for providing a signal based on the voltage Vout to a parasitic capacitance coupled to the terminal OUT, as compared with a circuit including two stages of buffer circuits. Further, this also makes it easier to adjust the slew rate of the output circuit 23b, 23c after setting the current driving capabilities that are different among the buffer circuits. This improves the degree of freedom in circuit design.

The present disclosure is directed to provision of an integrated circuit capable of reducing noise generation when a buffer circuit changes an output.

It is possible to provide an integrated circuit capable of reducing noise generation when a buffer circuit changes an output.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

It should be noted that the operations, procedures, steps, stages, and the like in each process in a device, a system, a program, and a method described in the claims, the specification, and the drawings may be performed in any order, unless a term such as "before", "prior to" or the like is explicitly used or an output of a previous process is used in a subsequent process. Even if terms such as "first", "next", and/or the like are used, for convenience, with respect to an operation flowchart in the claims, the specification, and the drawings, this does not mean that the flowchart needs to be performed in that order.

What is claimed is:

1. An integrated circuit having a terminal, the integrated circuit comprising:
   a signal output circuit configured to output a first digital signal of a first logic level or a second logic level in response to an analog signal;
   a first buffer circuit configured to
      raise a voltage at the terminal in response to the first digital signal of the first logic level, and
      lower the voltage at the terminal in response to the first digital signal of the second logic level;
   a first digital delay circuit configured to receive a clock signal, and to delay the first digital signal, to thereby output a resultant signal as a first delay signal, based on the received clock signal; and
   a second buffer circuit configured to
      raise the voltage at the terminal in response to the first delay signal of the first logic level, and
      lower the voltage at the terminal in response to the first delay signal of the second logic level.

2. The integrated circuit according to claim 1, further comprising:
   a memory circuit configured to store a frequency of the clock signal; and
   a clock signal output circuit configured to output the clock signal having the frequency stored in the memory circuit.

3. The integrated circuit according to claim 2, wherein the first digital delay circuit is a shift register configured to shift the first digital signal based on the received clock signal.

4. The integrated circuit according to claim 3, wherein
   the memory circuit stores setting information for setting a delay period of the first digital delay circuit,
   the shift register has a plurality of flip-flops coupled in series, each flip-flop having an output terminal, and
   the first digital delay circuit includes a first selector circuit that couples the second buffer circuit and one of the output terminals of the plurality of flip-flops that is selected based on the setting information.

5. The integrated circuit according to claim 2, wherein
   the memory circuit stores setting information for setting a delay period of the first digital delay circuit, and
   the first digital delay circuit includes
      a first counter circuit configured to count the delay period, based on the received clock signal, in response to the first digital signal reaching the first logic level,
      a second counter circuit configured to count the delay period, based on the received clock signal, in response to the first digital signal reaching the second logic level, and
      a delay signal output circuit configured to output the first delay signal, based on a first count result from the first counter circuit and a second count result from the second counter circuit.

6. The integrated circuit according to claim 1, further comprising:
   a sensor configured to detect a physical quantity, and to output the analog signal corresponding to the physical quantity to the signal output circuit.

7. The integrated circuit according to claim 6, wherein
   the sensor includes a pressure sensor and a temperature sensor,
   the analog signal includes
      a first analog signal outputted according to a pressure detected by the pressure sensor, and
      a second analog signal outputted according to a temperature detected by the temperature sensor, and the signal output circuit includes
      a second selector circuit configured to output the first analog signal and the second analog signal in a time-division manner,
      an analog-to-digital (AD) converter configured to convert an output from the second selector circuit, to thereby output a second digital signal, a control circuit configured to output a third digital signal obtained by correcting pressure data in the second digital signal, based on the temperature, and to control the second selector circuit, and an encoder configured to encode the third digital signal to thereby obtain the first digital signal.

8. The integrated circuit according to claim 1, further comprising:

a second digital delay circuit configured to delay the first digital signal longer than the first digital delay circuit does, to output a resultant signal as a second delay signal, based on the received clock signal, and a third buffer circuit configured to raise the voltage at the terminal in response to the second delay signal of the first logic level, and lower the voltage at the terminal in response to the second delay signal of the second logic level.

* * * * *